United States Patent [19]
Chao

[11] Patent Number: 5,952,689
[45] Date of Patent: *Sep. 14, 1999

[54] SEMICONDUCTOR MEMORY DEVICE HAVING TREE-TYPE CAPACITOR

[75] Inventor: Fang-Ching Chao, Hsinchu, Taiwan

[73] Assignee: United Microelectronics Corp., Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/706,732

[22] Filed: Sep. 6, 1996

[30] Foreign Application Priority Data

Aug. 16, 1996 [TW] Taiwan ................................. 85110005

[51] Int. Cl.$^6$ ................................................. H01L 27/108
[52] U.S. Cl. ............................................ 257/308; 257/307
[58] Field of Search ..................................... 257/307, 308, 257/306, 296, 309

[56] References Cited

U.S. PATENT DOCUMENTS

| | | |
|---|---|---|
| 5,071,783 | 12/1991 | Taguchi et al. ................ 437/52 |
| 5,077,688 | 12/1991 | Kumanoya et al. . |
| 5,089,869 | 2/1992 | Matsuo et al. . |
| 5,102,820 | 4/1992 | Chiba . |
| 5,126,810 | 6/1992 | Gotou . |
| 5,142,639 | 8/1992 | Kohyama et al. . |
| 5,155,657 | 10/1992 | Oehrlein et al. . |
| 5,158,905 | 10/1992 | Ahn . |
| 5,164,337 | 11/1992 | Ogawa et al. . |
| 5,172,201 | 12/1992 | Suizu ............................ 257/303 |
| 5,196,365 | 3/1993 | Gotou . |
| 5,206,787 | 4/1993 | Fujioka . |
| 5,266,512 | 11/1993 | Kirsch . |
| 5,274,258 | 12/1993 | Ahn . |
| 5,338,955 | 8/1994 | Tamura et al. . |
| 5,354,704 | 10/1994 | Yang et al. . |
| 5,371,701 | 12/1994 | Lee et al. . |
| 5,389,568 | 2/1995 | Yun . |
| 5,399,518 | 3/1995 | Sim et al. . |
| 5,438,011 | 8/1995 | Blalock et al. . |

(List continued on next page.)

FOREIGN PATENT DOCUMENTS

| | | |
|---|---|---|
| 0 516 031 A1 | 12/1992 | European Pat. Off. . |
| 4-26156 | 1/1992 | Japan . |
| 5-21745 | 1/1993 | Japan . |
| 5-251657 | 9/1993 | Japan . |
| 6-151748 | 5/1994 | Japan . |
| 2 252 447 | 8/1992 | United Kingdom . |

OTHER PUBLICATIONS

"Mini–Trenches in Polysilicon For Dram Storage Capacitance Enhancement", IBM Technical Disclosure Bulletin, vol. 33, No. 9, Feb. 1991.

Ema et al., "3–Dimensional Stacked Capacitor Cell for 16M and 64M DRAMS", International Electron Devices Meeting, pp. 592–595, Dec. 1988.

Wakamiya et al., "Novel Stacked Capacitor Cell for 64–Mb DRAM", 1989 Symposium on VLSI Technology Digest of Technical papers, pp. 69–70.

(List continued on next page.)

Primary Examiner—Sara Crane
Attorney, Agent, or Firm—Rabin & Champagne, P.C.

[57] ABSTRACT

A semiconductor memory device with a tree-type capacitor having increased area for reliable storage thereon of electrical charges representative of data. The tree-type capacitor includes a storage electrode including a trunk-like conductive layer and at least a branch-like conductive layer. The trunk-like conductive layer is electrically coupled to one of the source/drain regions of a transfer transistor in the semiconductor memory device and extends substantially upright. The branch-like conductive layer has one end connected to the trunk-like conductive layer and can be structured in various shapes that allow the branch-like conductive layer to have an increased surface area. A dielectric layer is formed over exposed surfaces of the trunk-like conductive layer and the branch-like conductive layer. An overlaying conductive layer is formed over the dielectric layer and serves as an opposing electrode for the tree-type capacitor.

11 Claims, 27 Drawing Sheets

U.S. PATENT DOCUMENTS

| | | |
|---|---|---|
| 5,443,993 | 8/1995 | Park et al. . |
| 5,453,633 | 9/1995 | Yun .......................................... 257/306 |
| 5,460,996 | 10/1995 | Ryou . |
| 5,478,768 | 12/1995 | Iwasa . |
| 5,478,770 | 12/1995 | Kim . |
| 5,482,886 | 1/1996 | Park et al. . |
| 5,508,222 | 4/1996 | Sakao . |
| 5,521,419 | 5/1996 | Wakamiya et al. . |
| 5,523,542 | 6/1996 | Chen et al. . |
| 5,543,346 | 8/1996 | Keum et al. . |
| 5,550,080 | 8/1996 | Kim . |
| 5,561,309 | 10/1996 | Cho et al. . |
| 5,561,310 | 10/1996 | Woo et al. . |
| 5,572,053 | 11/1996 | Ema . |
| 5,595,931 | 1/1997 | Kim . |
| 5,604,148 | 2/1997 | Lur ............................................ 437/60 |

OTHER PUBLICATIONS

Ema et al., "3–Dimensional Stacked Capacitor Cell for $16^M$ and 64M DRAMS", International Electron Devices Meeting, pp. 592–595, Dec. 1988.

Wakamiya et al., "Novel Stacked Capacitor Cell for 64–Mb DRAM", 1989 Symposium on VLSI Technology Digest of Technical Papers, pp. 69–70.

SEMICONDUCTOR MEMORY DEVICE HAVING TREE-TYPE CAPACITOR

BACKGROUND OF THE INVENTION

1. Field of the Invention

This invention relates in general to semiconductor memory devices, and more particularly to a structure of a dynamic random access memory (DRAM) cell substantially composed of a transfer transistor and a charge storage capacitor.

2. Description of the Related Art

FIG. 1 is a circuit diagram of a memory cell for a DRAM device. As shown in the drawing, a DRAM cell is substantially composed of a transfer transistor T and a charge storage capacitor C. A source of the transfer transistor T is connected to a corresponding bit line BL, and a drain thereof is connected to a storage electrode 6 of the charge storage capacitor C. A gate of the transfer transistor T is connected to a corresponding word line WL. An opposing electrode 8 of the capacitor C is connected to a constant power source. A dielectric film 7 is provided between the storage electrode 6 and the opposing electrode 8.

In the DRAM manufacturing process, a two-dimensional capacitor called a planar type capacitor is mainly used for a conventional DRAM having a storage capacity less than 1M (mega=million) bits. In the case of a DRAM having a memory cell using a planar type capacitor, electric charges are stored on the main surface of a semiconductor substrate, so that the main surface is required to have a large area. This type of a memory cell is therefore not suited to a DRAM having a high degree of integration. For a high integration DRAM, such as a DRAM with more than 4M bits of memory, a three-dimensional capacitor, called a stacked-type or a trench-type capacitor, has been introduced.

With stacked-type or trench-type capacitors, it has been made possible to obtain a larger memory in a similar volume. However, to realize a semiconductor device of an even higher degree of integration, such as a very-large-scale integration (VLSI) circuit having a capacity of 64M bits, a capacitor of such a simple three-dimensional structure as the conventional stacked-type or trench-type, turns out to be insufficient.

One solution for improving the capacitance of a capacitor is to use the so-called fin-type stacked capacitor, which is proposed in Ema et al., "3-Dimensional Stacked Capacitor Cell for 16M and 64M DRAMs", International Electron Devices Meeting, pp. 592–595, December 1988. The fin-type stacked capacitor includes electrodes and dielectric films which extend in a fin shape in a plurality of stacked layers. DRAMs having the fin-type stacked capacitor are also disclosed in U.S. Pat. Nos. 5,071,783 (Taguchi et al.); 5,126,810 (Gotou); 5,196,365 (Gotou); and 5,206,787 (Fujioka).

Another solution for improving the capacitance of a capacitor is to use the so-called cylindrical-type stacked capacitor, which is proposed in Wakamiya et al., "Novel Stacked Capacitor Cell for 64-Mb DRAM", 1989 Symposium on VLSI Technology Digest of Technical Papers, pp. 69–70. The cylindrical-type stacked capacitor includes Digest of Technical Papers, pp. 69–70. The cylindrical-type stacked capacitor includes electrodes and dielectric films which extend in a cylindrical shape to increase the surface areas of the electrodes. A DRAM having the cylindrical-type stacked capacitor also is disclosed in the U.S. Pat. No. 5,077,688 (Kumanoya et al.).

With the trend toward increased integration density, the size of the DRAM cell in a plane (the area it occupies in a plane) must be further reduced. Generally, a reduction in the size of the cell leads to a reduction in charge storage capacity (capacitance). Additionally, as the capacitance is reduced, the likelihood of soft errors arising from the incidence of α-rays is increased. Therefore, there is still a need in this art to design a new structure of a storage capacitor which can achieve the same capacitance, while occupying a smaller area in a plane, and a suitable method of fabricating the structure.

SUMMARY OF THE INVENTION

It is therefore an object of the invention to provide a semiconductor memory device which is structured with a tree-type capacitor that allows an increased area for charge storage.

In accordance with the foregoing and other objects of the invention, a new and improved semiconductor memory device and a method for fabricating the same are provided.

A semiconductor memory device according to the invention has a tree-type capacitor of increased area for reliable storage thereon of electrical charges representative of data. The tree-type capacitor includes a storage electrode consisting of a trunk-like conductive layer and one or more branch-like conductive layers. The trunk-like conductive layer is electrically coupled to one of the source/drain regions of the transfer transistor in the semiconductor memory device and is substantially upright. The branch-like conductive layer has one end connected to the trunk-like conductive layer and can be structured in various shapes that allow the branch-like conductive layer to have increased surface area. A dielectric layer is formed over exposed surfaces of the trunk-like conductive layer and the branch-like conductive layer and an overlaying conductive layer is formed over the dielectric layer which serves as an opposing electrode for the tree-type capacitor.

A method for fabricating a semiconductor memory device according to the invention includes a substrate, a transfer transistor having source/drain regions in the substrate, and a tree-type capacitor electrically coupled to one of the source/drain regions. An insulating layer which covers the transfer transistor is formed over the substrate. A trunk-like conductive layer is formed so as to penetrate through the insulating layer to become electrically connected with one of the source/drain regions. A conductive layer is formed over the trunk-like conductive layer. Another conductive layer which is electrically connected to the trunk-like conductive layer and the first conductive layer is then formed. Selected parts of the first and second conductive layers are etched away so as to form branch-like conductive layers, so that the trunk-like conductive layer and the branch-like conductive layers in combination define a storage electrode for the tree-type capacitor. A dielectric layer is formed over exposed surfaces of the branch-like conductive layers, and a further conductive layer is formed over the dielectric layer to serve as an opposing electrode of the charge storage capacitor.

A method for fabricating one embodiment of such a semiconductor memory device according to the invention includes forming a first insulating layer over the substrate, which covers the transfer transistor. Then, according to the embodiment, at least a trunk-like conductive layer is formed over the first insulating layer, so that the trunk-like conductive layer penetrates through the first insulating layer to become electrically connected with one of the source/drain regions. Subsequently, a first conductive layer is formed over the trunk-like conductive layer, and over the first insulating layer. Selected parts of the first conductive layer that lie above the trunk-like conductive layer are then removed. A second conductive layer which is electrically connected to the trunk-like conductive layer and the first conductive layer is then formed. Selected parts of the first and second conductive layers are etched away so as to form branch-like conductive layers therefrom, so that the trunk-like conductive layer and the branch-like conductive layers in combination define a storage electrode for the tree-type capacitor. A dielectric layer is formed over exposed surfaces of the branch-like conductive layers, and a third conductive layer is formed over the dielectric layer to serve as an opposing electrode of the charge storage capacitor.

BRIEF DESCRIPTION OF DRAWINGS

Other objects, features, and advantages of the invention will become apparent from the following detailed description of the preferred but non-limiting embodiments. The description is made with reference to the accompanying drawings in which.

DETAILED DESCRIPTION OF THE PREFERRED EMBODIMENTS

First Preferred Embodiment

A description will be given of a first embodiment of a semiconductor memory device having a tree-type charge storage capacitor according to the invention, by referring to FIGS. 2A through 2G. This embodiment of the semiconductor memory device is fabricated by a first preferred method for fabricating a semiconductor memory device according to the invention.

Figure 1:
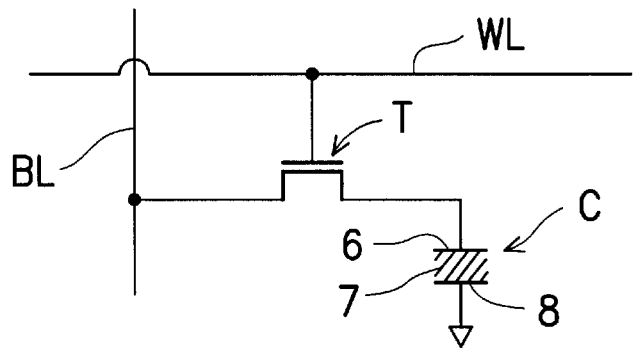
FIG. 1 is a circuit diagram of a memory cell of a DRAM device.
Figure 2A:
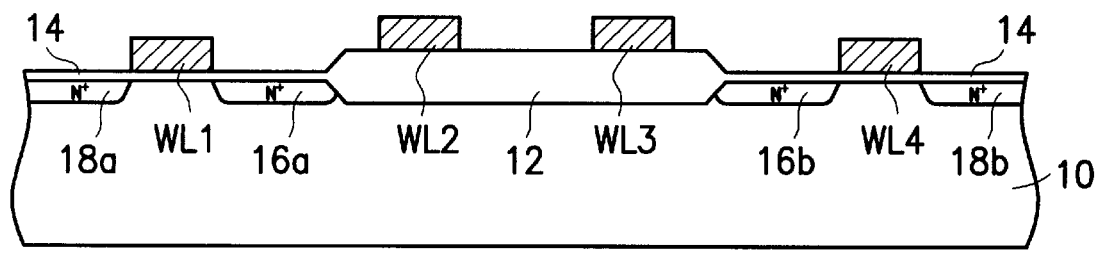
FIGS. 2A through 2G are cross-sectional views depicting the process steps for fabricating a first embodiment of a semiconductor memory cell having a tree-type capacitor according to the invention.

Referring to FIG. 2A, a surface of a silicon substrate 10 is subjected to thermal oxidation by the LOCOS (local oxidation of silicon) technique, and thereby a field oxidation film 12 having a thickness of, for example, approximately 3,000 Å (angstroms) is formed. Subsequently, a gate oxidation film 14 having a thickness of approximately 150 Å, for example, is formed by subjecting the silicon substrate 10 to the thermal oxidation process. After that, a polysilicon film having a thickness of approximately 2,000 Å, for example, is deposited on the entire surface of the silicon substrate 10 by the CVD (chemical vapor deposition) or LPCVD (low pressure CVD) method, In order to obtain a polysilicon film of high conductivity, suitable impurities such as phosphorus ions are diffused into the polysilicon film. So as to further raise the film's conductivity, a refractory metal layer, for example, can be deposited over the polysilicon film and then an annealing process is carried out to form polycide. The refractory metal layer can be for example a layer of tungsten (W) deposited to a thickness, for example, of approximately 2,000 Å. After that, a conventional photolithographic and etching process is used to define and form a polysilicon metallization layer over the wafer which serves as word lines WL1 through WL4, as shown in FIG. 2A. Using the word lines WL1 through WL4 as masks, an ion implantation process is then performed on the wafer to diffuse an impurity (such as arsenic ions) into the silicon substrate 10 with an energy of about 70 KeV and a concentration of approximately $1 \times 10^{15}$ atoms/cm$^2$, for example. As a result of this ion implantation, drain regions 16a and 16b and source regions 18a and 18b are formed in the silicon substrate 10.

Figure 2B:
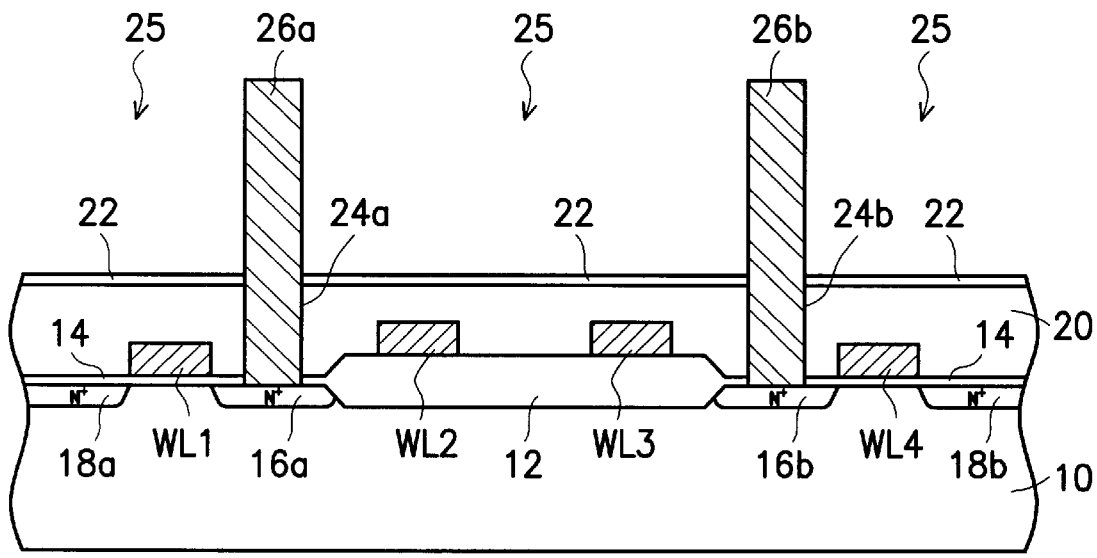

Referring next to FIG. 2B, in the subsequent step the CVD method is used to deposit a planarization insulating layer 20, such as a layer of borophosphosilicate glass (BPSG), to a thickness of approximately 7,000 Å, for example. Then the same method is used to deposit an etching protection layer 22, such as a silicon nitride layer, over the planarization insulating layer 20 to a thickness of approximately 1,000 Å, for example. After that, a conventional photolithographic and etching process is used to define and etch away selected parts of the etching protection layer 22 and the planarization insulating layer 20, so as to form storage electrode contact holes 24a, 24b which extend from the top surface of the etching protection layer 22 to the surface of the drain regions 16a, 16b. Subsequently, a thick polysilicon layer is deposited over the wafer to a thickness of 7,000 Å, for example. The thick polysilicon layer can be further diffused with an impurity such as arsenic ions so as to increase the conductivity thereof After that, a conventional photolithographic and etching process is performed on the thick polysilicon layer so as to define and form polysilicon pillars 26a, 26b which extend from the surface of the drain regions 16a, 16b upright through the storage electrode contact holes 24a, 24b. Also as a result of this, a recess 25 is defined between the two polysilicon pillars 26a, 26b. The polysilicon pillars 26a, 26b are to be used as a trunk-like conductive layer in the storage electrodes for the tree-type capacitor according to the invention.

Figure 2C:
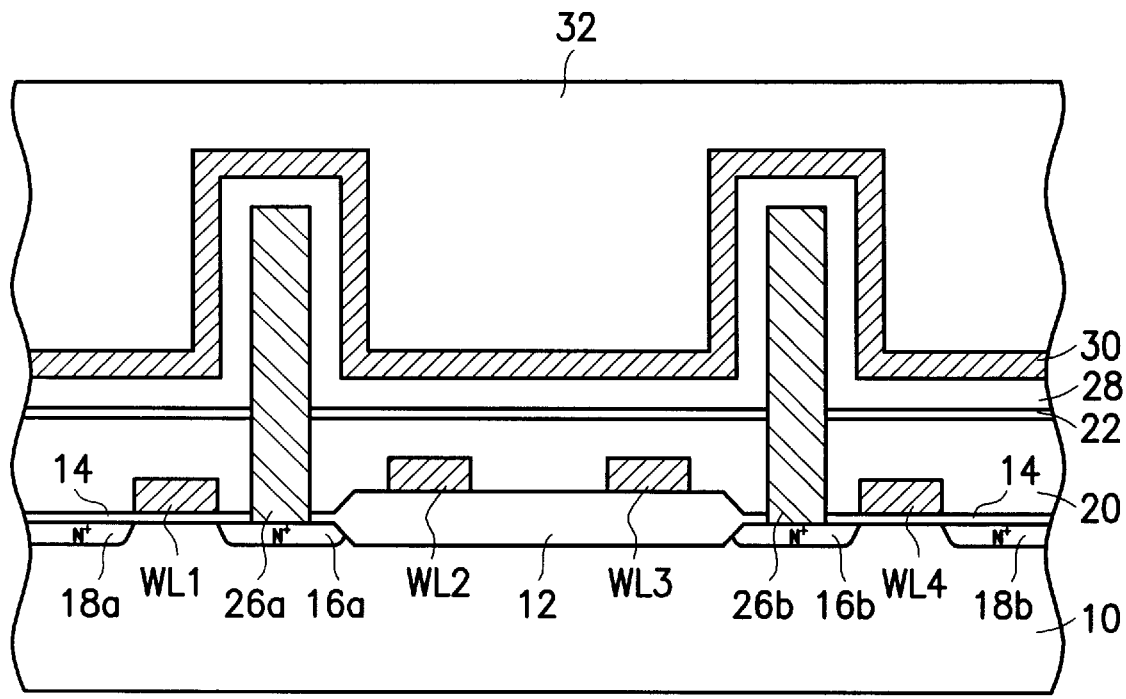

Referring next to FIG. 2C, in the subsequent step the CVD method is used repeatedly to form successively a first insulating layer 28, a polysilicon layer 30, and a second insulating layer 32 over the wafer. The first and second insulating layers 28, 32 are preferably silicon oxide layers. The first insulating layer 28 and the polysilicon layer 30 are each deposited to a thickness of approximately 1,000 Å, for example. The second insulating layer 32 should be deposited as a minimum to a thickness that fills up the recess 25 between the two polysilicon pillars 26a and 26b, which is at least about 7,000 Å in this embodiment. Further, the polysilicon layer 30 can be diffused with impurities such as arsenic (As) ions, so as to increase the conductivity thereof.

Figure 2D:
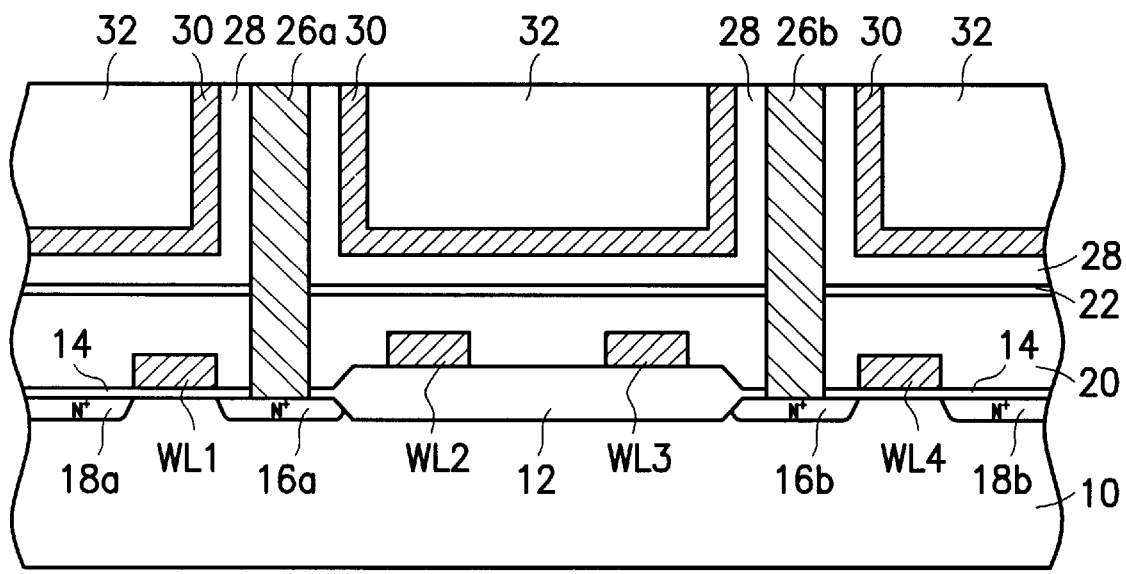

Referring next to FIG. 2D, in the subsequent step, a chemical mechanical polishing (CMP) process is performed on the surface of the wafer of FIG. 2C, so as to polish away an upper part of the polysilicon pillars 26a and 26b.

Figure 2E:
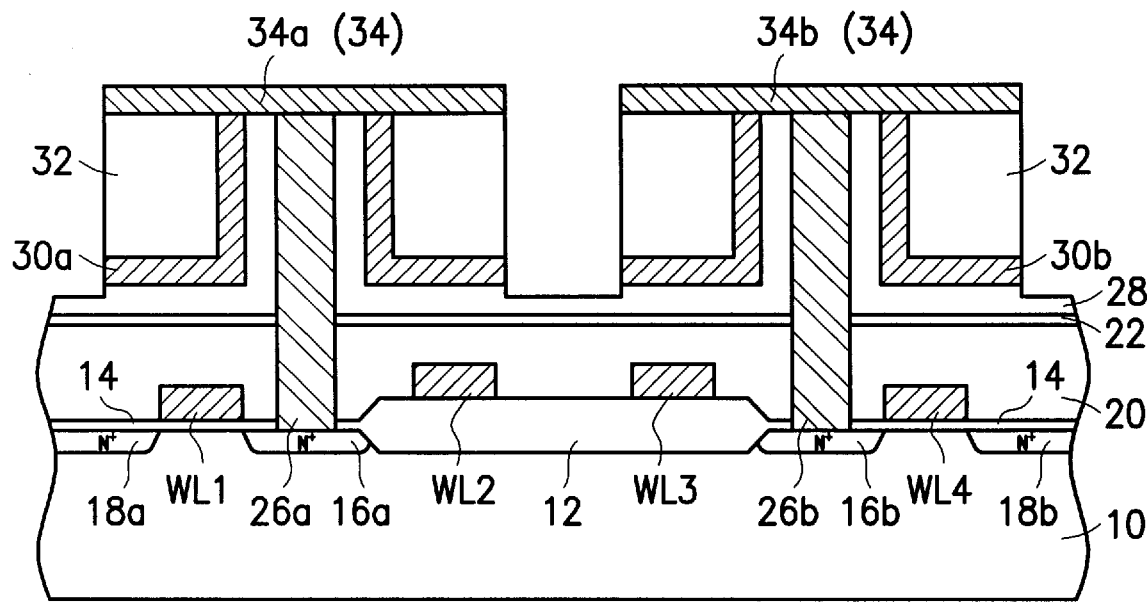

Referring next to FIG. 2E, in the subsequent step a polysilicon layer 34 is deposited over the wafer to a thickness of approximately 7,000 Å, for example. Further, the polysilicon layer 34 can be diffused with impurities such as arsenic (As) ions, so as to increase the conductivity thereof. After that, a conventional photolithographic and etching process is performed on the wafer, so as to define and etch away selected parts of the polysilicon layer 34, the second insulating layer 32, and the polysilicon layer 30. As a result of this process, the polysilicon layer 34 is cut into separate sections 34a and 34b, and the polysilicon layer 30 is cut into separate sections 30a and 30b. These sections 34a, 34b and 30a, 30b are to be used as branch-like conductive layers in the storage electrodes for the tree-type capacitor according to the invention. For distinguishing purposes, the polysilicon sections 34a, 34b are in this specification referred to as "upper branch-like conductive layers" and the polysilicon sections 30a, 30b are referred to as "suspended branch-like conductive layers".

Figure 2F:
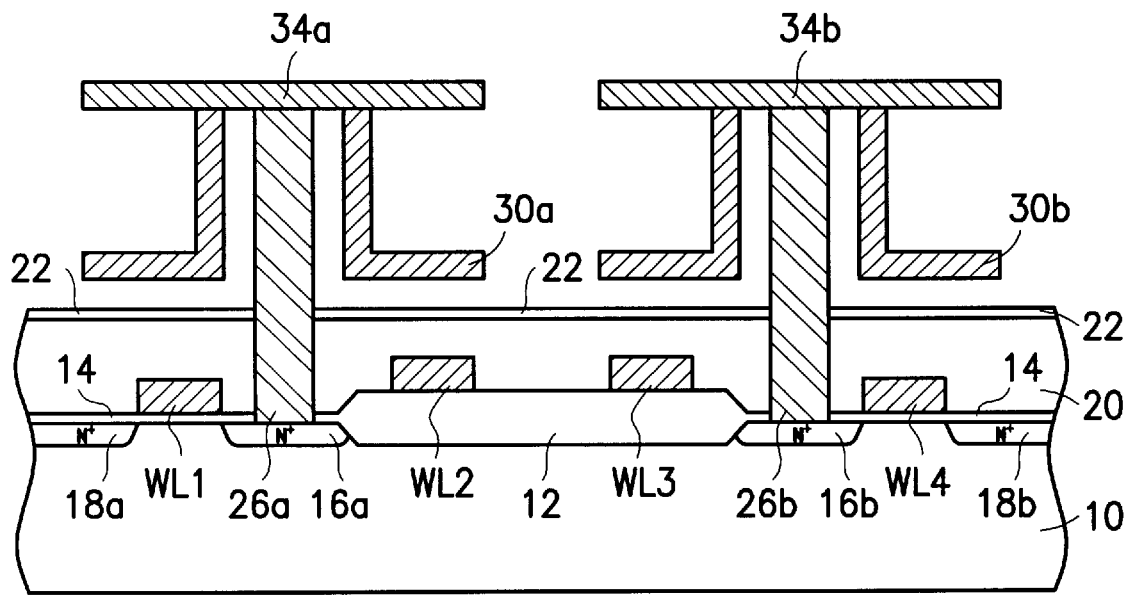

Referring next to FIG. 2F, in the subsequent step wet etching is performed on the wafer with the etching protection layer 22 as the etch end point, so as to remove the exposed insulating layers 32, 28. This completes the formation of the storage electrodes for the tree-type capacitor of DRAM cells in the wafer.

As shown in FIG. 2F, the thus formed storage electrodes are composed of the trunk-like polysilicon layers 26a, 26b, the upper branch-like polysilicon layers 34a, 34b, and the substantially L-shaped suspended branch-like polysilicon layers 30a, 30b. The trunk-like polysilicon layers 26a, 26b are respectively electrically coupled to the drain regions 16a and 16b of the transfer transistors in the DRAM. The upper branch-like polysilicon layers 34a, 34b each has its middle portion connected to the top of the trunk-like polysilicon layers 26a, 26b and substantially arranged at right angles with respect to the same. The substantially L-shaped suspended branch-like polysilicon layers 30a, 30b each extends downwards from beneath the upper branch-like polysilicon layers 34a, 34b a predetermined distance and then is angled to extend horizontally.

Figure 2G:
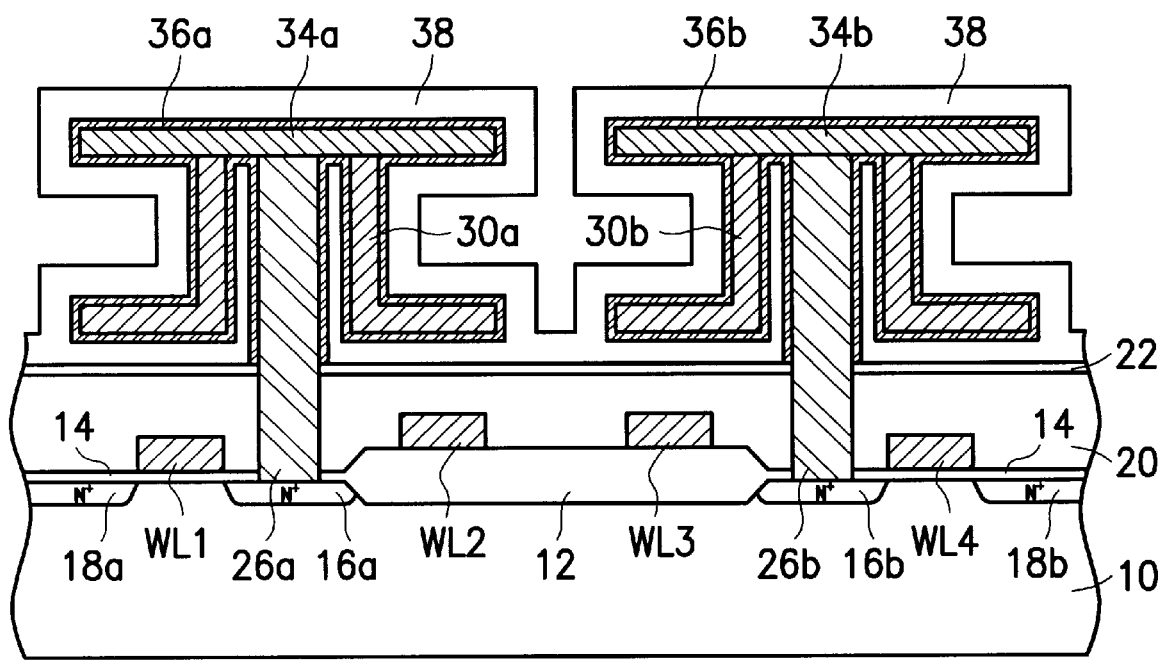

Referring next to FIG. 2G, in the subsequent step dielectric films 36a, 36a are respectively formed over the tree-like storage electrodes (26a, 30a, 34a) and (26b, 30b, 34b). These dielectric films 36a, 36a can be made of dielectric materials such as silicon dioxide ($SiO_2$), silicon nitride, NO (silicon nitride/silicon dioxide), ONO (silicon dioxide/silicon nitride/silicon dioxide), or the like. Subsequently, an opposing electrode 38 made of polysilicon, which opposes the storage electrodes (26a, 30a, 34a) and (26b, 30b, 34b), is formed over the dielectric films 36a, 36b. The process for forming the opposing electrode 38 includes a first step of depositing a polysilicon layer by the CVD method to a thickness of, for example, approximately 1,000 Å, a second step of diffusing N-type impurities into the polysilicon layer so as to increase the conductivity thereof, and a final step of using a conventional photolithographic and etching process to define and etch away selected parts of the polysilicon layer. The fabrication of the tree-type capacitors in the DRAM is then complete.

To complete the fabrication of the DRAM chip, the subsequent steps include fabricating bit lines, bonding pads, interconnections, passivations, and packaging. These steps involve only conventional techniques and are not related to the spirit of the invention, so that a detailed description thereof will not be provided herein.

Second Preferred Embodiment

In the foregoing first embodiment, the disclosed tree-type capacitor is provided with only one pair of suspended branches (i.e., the branch-like polysilicon layers 30a, 30b) beneath the upper branch-like conductive layers (i.e., the polysilicon layers 34a, 34b). However, the number of suspended branches is not limited to one and can be two or more. The second embodiment of the invention is a tree-type capacitor having two pairs of suspended branches of conductive layers, which will be described below with reference to FIGS. 3A through 3D.

The tree-type capacitor of the second embodiment is based on the wafer structure of FIG. 2B. Elements in FIGS. 3A through 3D that are identical to those in FIG. 2B are labeled with the same numerals.

Figure 3A:
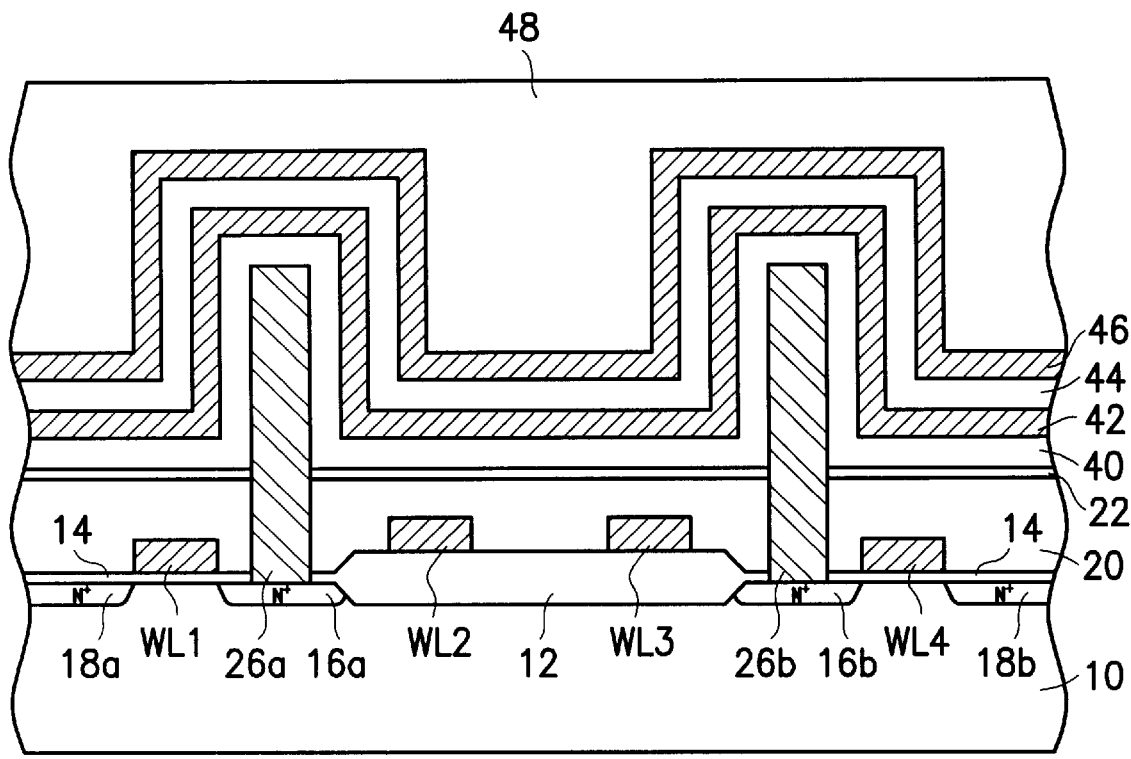
FIGS. 3A through 3D are cross-sectional views depicting the process steps for fabricating a second embodiment of a semiconductor memory cell having a tree-type capacitor according to the invention.

Referring to FIG. 3A together with FIG. 2B, the CVD method is used herein to successively form on the wafer of FIG. 2B alternate layers of insulation and polysilicon, including a first insulating layer 40, a first polysilicon layer 42, a second insulating layer 44, a second polysilicon layer 46, and a third insulating layer 48. The insulating layers 40, 44, 48 are made of insulating materials such as silicon oxide. The insulating layers 40, 44 and the polysilicon layers 42, 46 are each deposited to a thickness of approximately 1,000 Å, for example, and the insulating layer 48 is deposited to a thickness of approximately 7,000 Å, for example. Further, the polysilicon layers 42, 46 can be diffused with impurities such as arsenic (As) ions so as to increase the conductivity thereof.

Figure 3B:
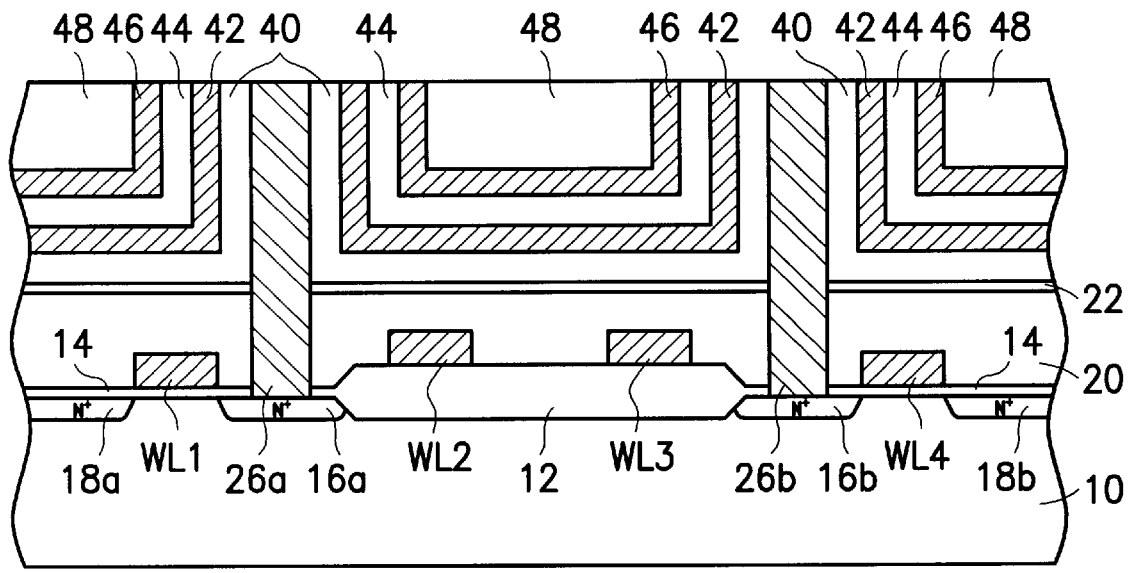

Referring next to FIG. 3B, in the subsequent step the CMP process is performed on the surface of the wafer of FIG. 3A, so as to polish away an upper part of the wafer until the top of the polysilicon pillars 26a, 26b is exposed.

Figure 3C:
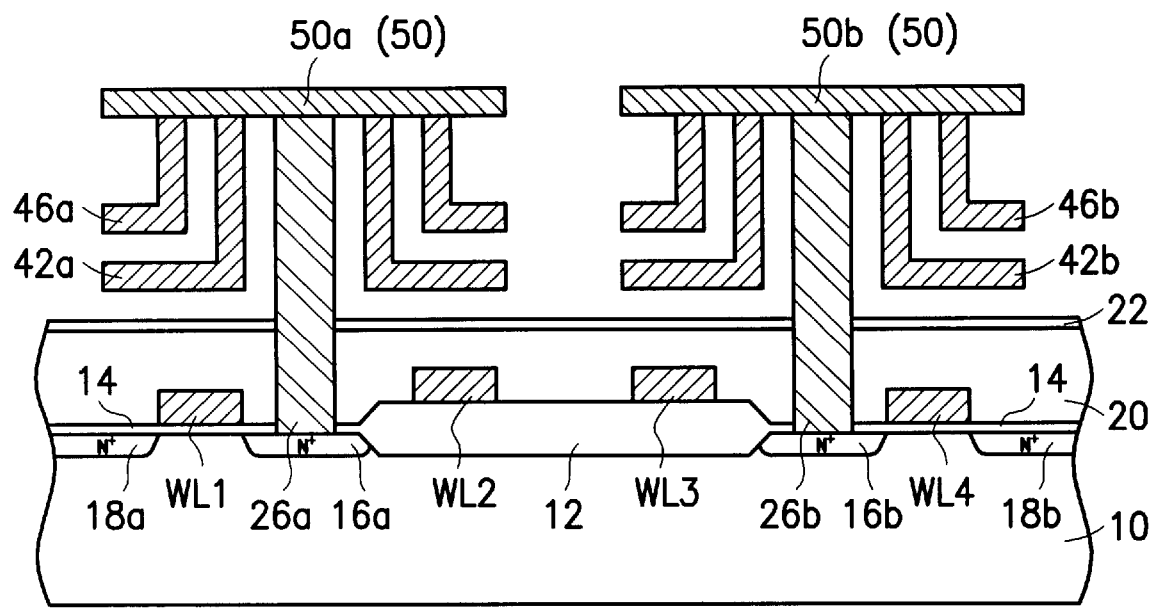

Referring next to FIG. 3C, in the subsequent step a polysilicon layer 50 is deposited over the wafer to a thickness of approximately 1,000 Å, for example. Further, the polysilicon layer 50 can be diffused with impurities such as arsenic (As) ions so as to increase the conductivity thereof. After that, a conventional photolithographic and etching process is performed on the wafer so as to define and etch away selected parts of the polysilicon layer 50, the third insulating layer 48, the second polysilicon layer 46, the second insulating layer 44, and the first polysilicon layer 42. As a result of this process, the polysilicon layer 50 is cut into separate sections 50a and 50d, the polysilicon layer 46 is cut into separate sections 46a and 46b, and the polysilicon layer 42 is cut into separate sections 42a and 42b. These sections 50a, 50d, 46a, 46b, 42a, 42b are to be used as branch-like conductive layers in the storage electrodes for the tree-type capacitor according to the invention. For distinguishing purpose, the polysilicon sections 50a, 50b are in this specification referred to as "upper branch-like conductive layers" and the polysilicon sections 46a, 46b, 42a, 42b are referred to as "suspended branch-like conductive layers".

Subsequently, wet etching is performed on the wafer, with the etching protection layer 22 as the etch end point, so as to remove the exposed insulating layers 40, 44, 48. This completes the formation of the storage electrodes for the tree-type capacitor of DRAM cells in the wafer.

As shown in FIG. 3C, the thus formed storage electrodes are composed of the trunk-like polysilicon layers 26a, 26b, the upper branch-like polysilicon layers 50a, 50d, and the substantially L-shaped suspended branch-like polysilicon layers 42a, 46a and 42b, 46b. The trunk-like polysilicon layers 26a, 26b are respectively electrically coupled to the drain regions 16a and 16b of the transfer transistors in the DRAM. The upper branch-like polysilicon layers 50a, 50b are connected to the top of the trunk-like polysilicon layers 26a, 26b and substantially arranged at right angles with respect to the same. The two pairs of substantially L-shaped suspended branch-like polysilicon layers 46a, 42a and 46b, 42b each extends downwards from beneath the upper branch-like polysilicon layers 50a, 50b a predetermined distance, and then angled to extend horizontally.

Figure 3D:
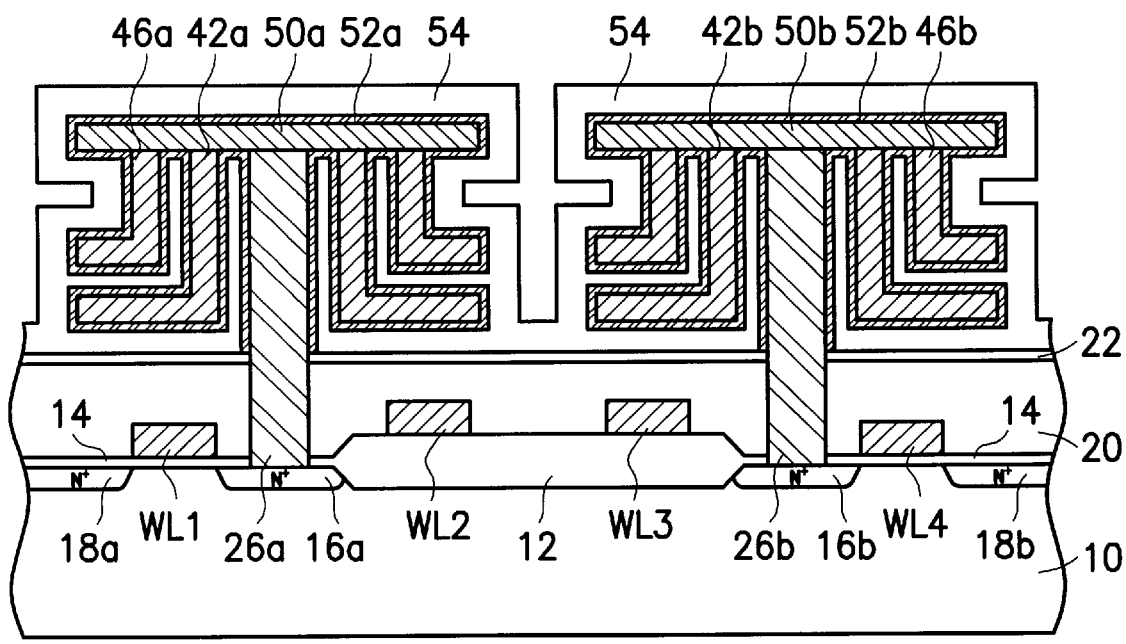

Referring next to FIG. 3D, in the subsequent step dielectric films 52a, 52b are respectively formed on the tree-like storage electrodes 50a, 46a, 42a and 50d, 46b, 42b. Subsequently, an opposing polysilicon electrode 54 is formed over the dielectric films 52a, 52b. The process for forming the opposing electrode 54 includes a first step of depositing a polysilicon layer by the CVD method, a second step of diffusing N-type impurities into the polysilicon layer so as to increase the conductivity thereof, and a final step of using conventional photolithographic and etching processes to etch away selected parts of the polysilicon layer. After that, the fabrication for the tree-type capacitors in the DRAM is complete.

Third Preferred Embodiment

In the foregoing first and second embodiments, the one pair of suspended branches nearest to the trunk-like conductive layer is separated from the underneath etching protection layer therebelow (i.e., the etching protection layer 22). However, the invention is not limited to such a structure. The third embodiment of the invention includes a tree-type capacitor having the one pair of suspended branches nearest to the trunk-like conductive layer in contact with the etching protection layer, as will be described below with reference to FIGS. 4A through 4C.

The tree-type capacitors of the third embodiment are also based on the structure of FIG. 2B. Elements in FIGS. 4A through 4C that are identical to those in FIG. 2B are labeled with the same numerals.

Figure 4A:
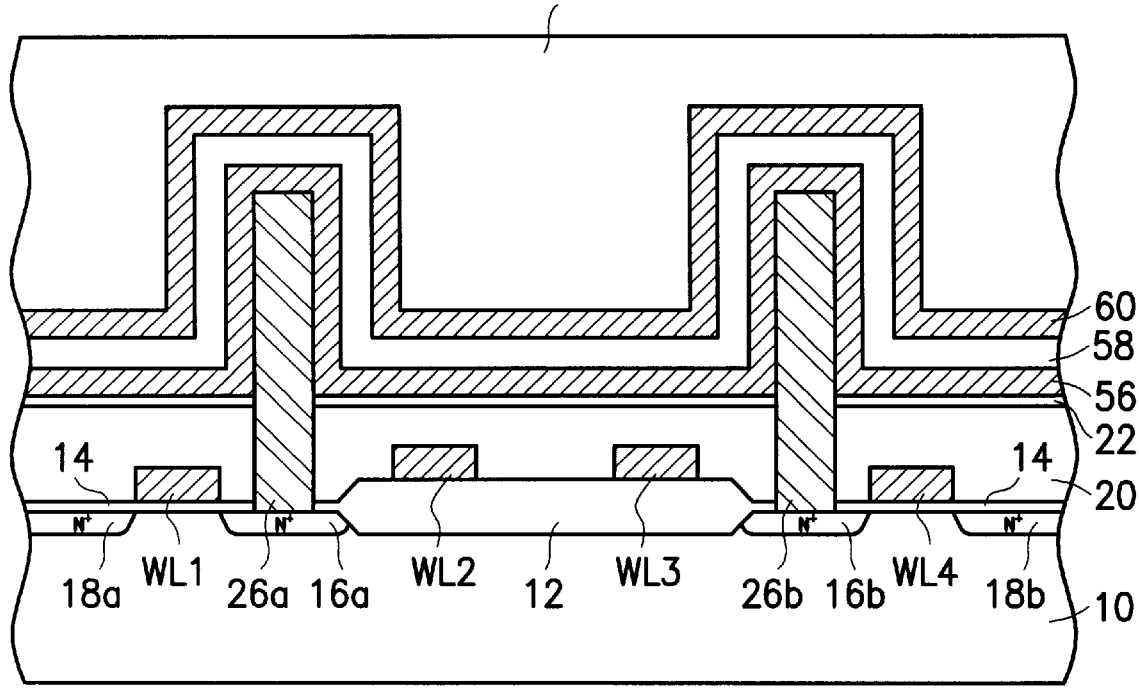
FIGS. 4A through 4C are cross-sectional views depicting the process steps for fabricating a third embodiment of a semiconductor memory cell having a tree-type capacitor according to the invention.

Referring to FIG. 4A together with FIG. 2B, from the wafer of FIG. 2B, the CVD method is used successively to form alternate layers of insulation and polysilicon, including a first polysilicon layer 56, a first insulating layer 58, a second polysilicon layer 60, and a second insulating layer 62.

Figure 4B:
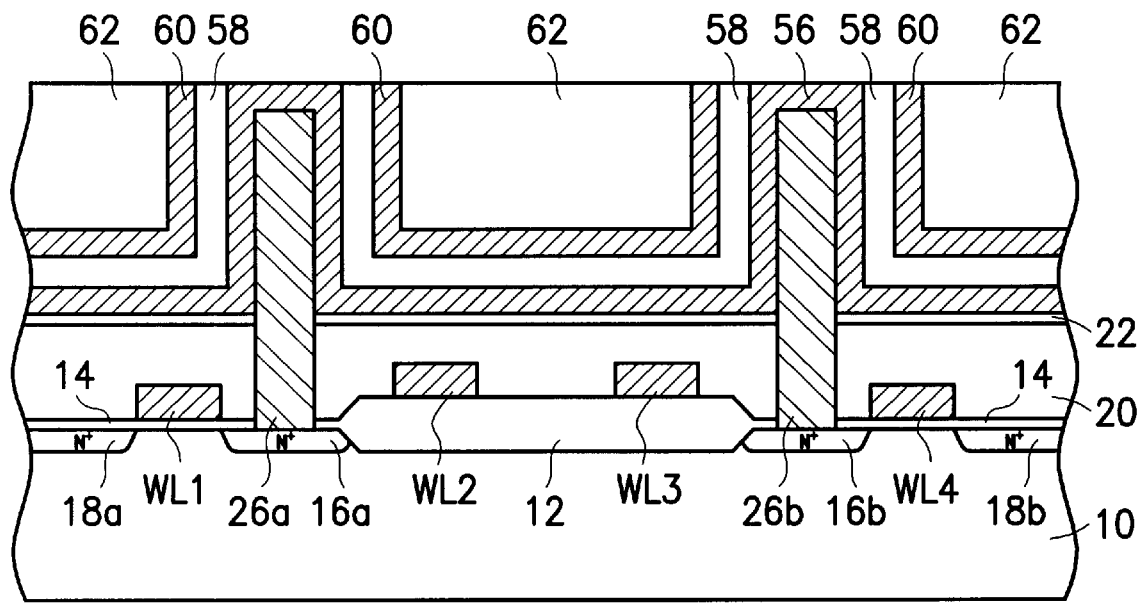

Referring next to FIG. 4B, next the CMP process is performed on the surface of the wafer of FIG. 4A, so as to polish away an upper part of the wafer until the surface of the topmost part of the first polysilicon layer 56 that lies above the polysilicon pillars 26a, 26b is exposed or until the top of the polysilicon pillars 26a, 26b is exposed.

Figure 4C:
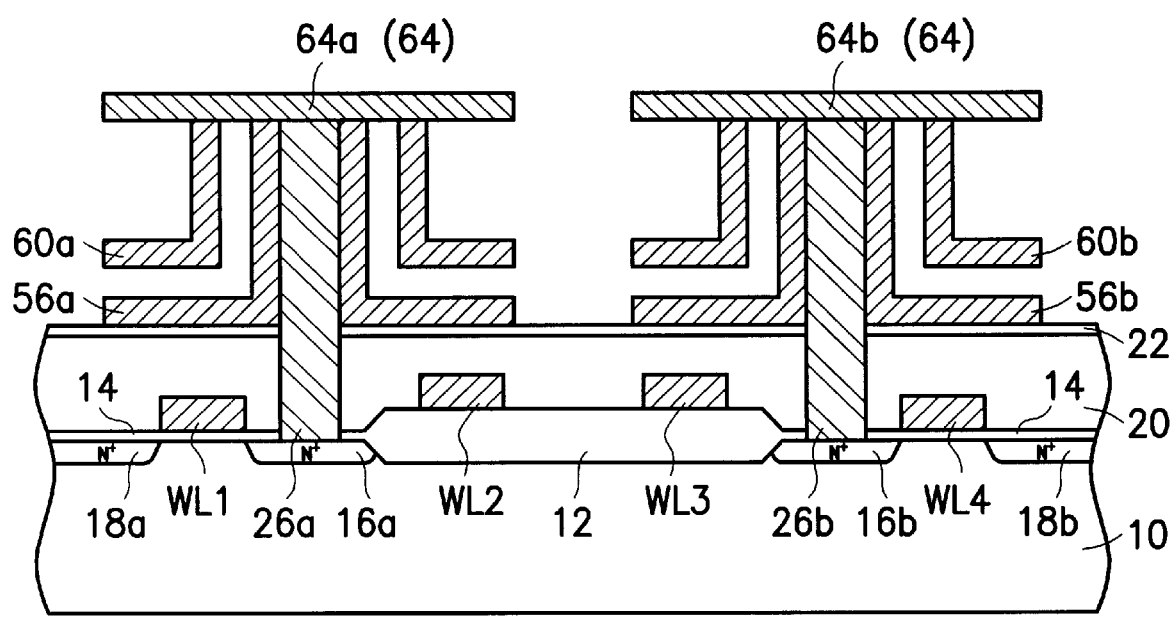

Referring next to FIG. 4C, in a subsequent step a polysilicon layer 64 is deposited over the wafer. After that, a conventional photolithographic and etching process is performed on the wafer so as to define and etch away selected parts of the polysilicon layers 56, 60, and 64. As a result of this process, the polysilicon layer 56 is cut into separate sections 56a and 56b, the polysilicon layer 60 is cut into separate sections 60a and 60b, and the polysilicon layer 64 is cut into separate sections 64a and 64b. These sections 56a, 56b, 60a, 60b, 64a, 64b are to be used as branch-like conductive layers in the storage electrodes for the tree-type capacitor according to the invention.

Subsequently, wet etching is performed on the wafer, with the etching protection layer 22 as the etch end point, so as to remove the exposed insulating layers 58, 62. This completes the formation of the storage electrodes for the tree-type capacitor of DRAM cells in the wafer.

As shown in FIG. 4C, the thus formed storage electrodes are composed of the trunk-like polysilicon layers 26a, 26b, the upper branch-like polysilicon layers 64a, 64b, and two pairs of substantially L-shaped suspended branch-like polysilicon layers 56a, 60a and 56b, 60b. The trunk-like polysilicon layers 26a, 26b are respectively electrically coupled to the drain regions 16a and 16b of the transfer transistors in the DRAM. The upper branch-like polysilicon layers 64a, 64b are connected to the top of the trunk-like polysilicon layers 26a, 26b and substantially arranged at right angles with respect to the same. The two pairs of substantially L-shaped suspended branch-like polysilicon layers 56a, 60a and 56b, 60b each extend downwards from beneath the branch-like polysilicon layers 64a, 64b a predetermined distance and are then angled to extend horizontally. It is a distinguishing part of this embodiment from the previous ones that the horizontal segments of the pairs of substantially L-shaped suspended branch-like polysilicon layer 56a, 56b each come in contact with the etching protection layer 22.

Fourth Preferred Embodiment

The fourth preferred embodiment is substantially similar in structure to the foregoing third embodiment, but different in the process steps used to form the same structure. These different process steps will be described below, with reference to FIGS. 5A through 5C.

The tree-type capacitor of the fourth embodiment is based on the structure of FIG. 2B. Elements in FIGS. 5A through 5C that are identical to those in FIG. 2B are labeled with the same numerals.

Figure 5A:
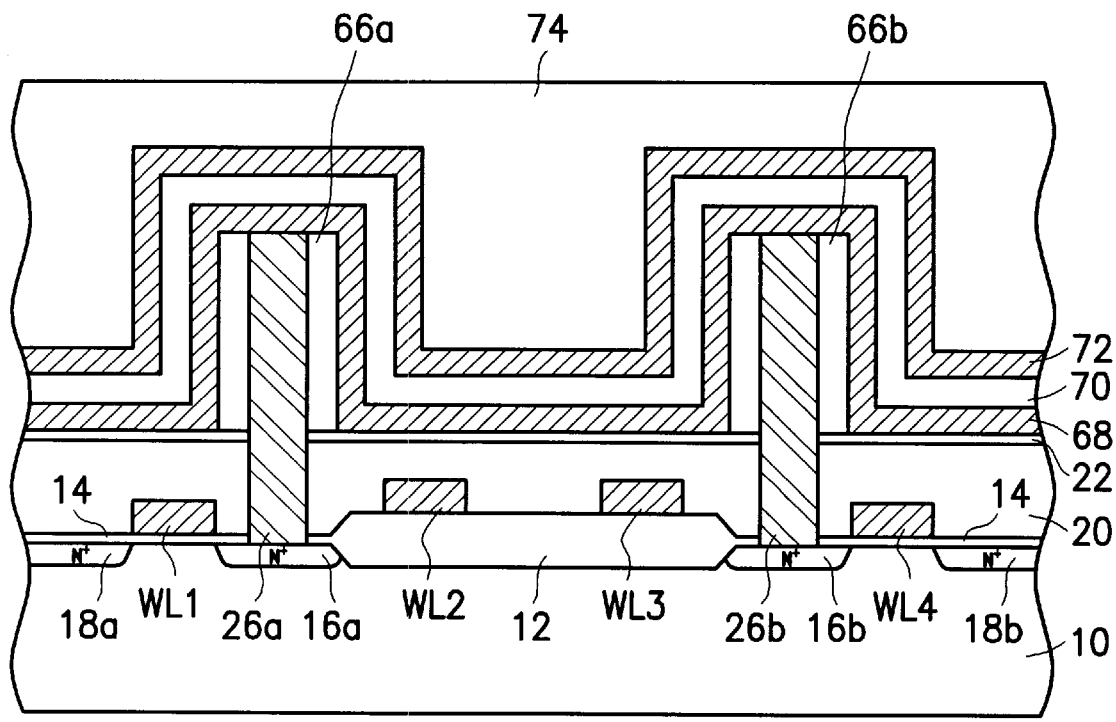
FIGS. 5A through 5C are cross-sectional views depicting the process steps for fabricating a fourth embodiment of a semiconductor memory cell having a tree-type capacitor according to the invention.

Referring first to FIG. 5A together with FIG. 2B, after formation of the wafer structure of FIG. 2B, there are formed insulating spacers 66a, 66b, made of insulating materials such as silicon dioxide ($SiO_2$), on the sidewalls of the polysilicon pillars 26a, 26b. The process for forming the insulating spacers 66a, 66b includes a first step of using the CVD method to deposit a layer of silicon dioxide ($SiO_2$) to a thickness of 1,000 Å, for example, and a second step of etching back on the silicon dioxide ($SiO_2$) layer. After that, the CVD method is used repetitively to deposit successively a first polysilicon layer 68, a first insulating layer 70, a second polysilicon layer 72, and a second insulating layer 74.

Figure 5B:
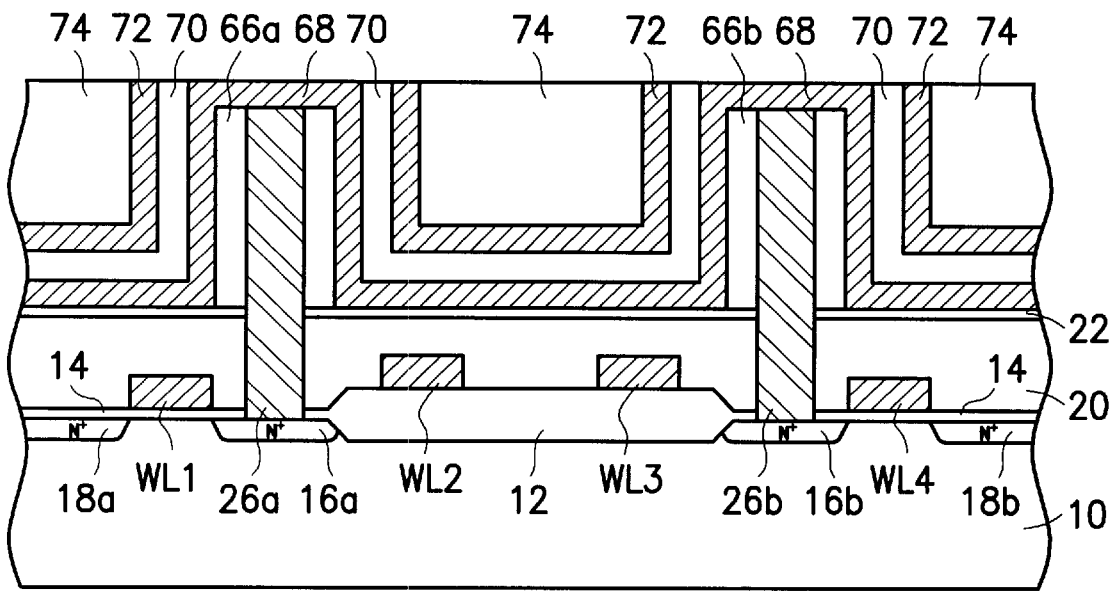

Referring next to FIG. 5B, in the subsequent step the CMP process is performed on the surface of the wafer of FIG. 5A, so as to polish away an upper part of the wafer until the surface of the topmost segment of the first polysilicon layer 68 or the top of the polysilicon pillars 26a, 26b is exposed.

Figure 5C:
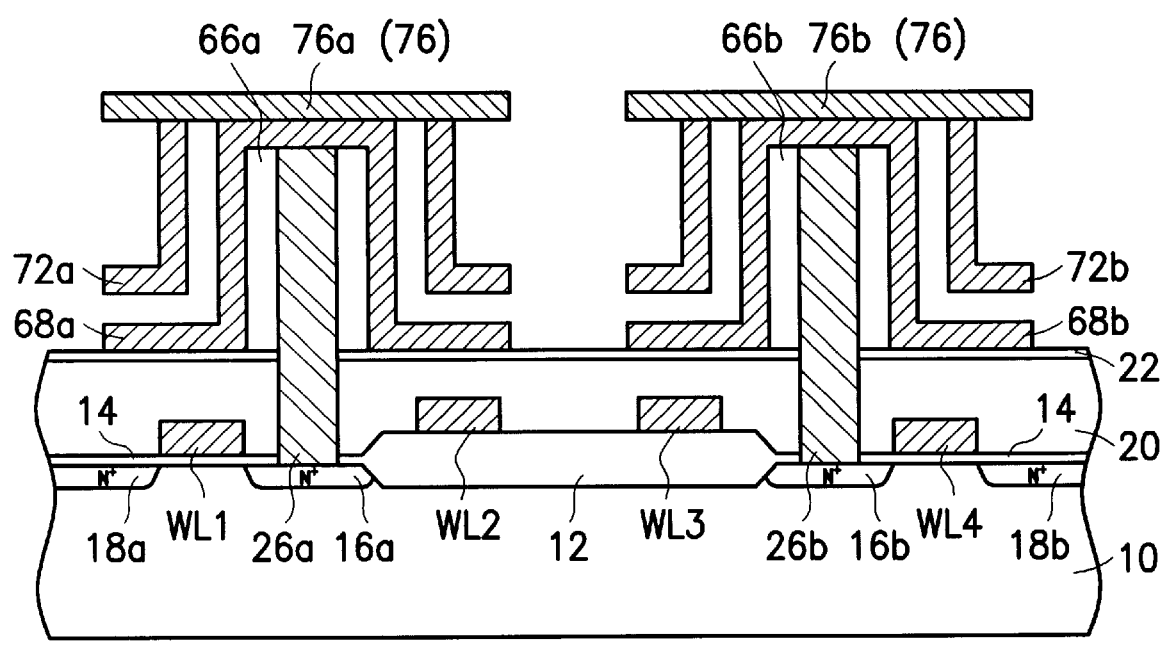

Referring next to FIG. 5C, in the subsequent step a polysilicon layer 76 is deposited over the wafer. After that, a conventional photolithographic and etching process is performed on the wafer to define and etch away selected parts of the polysilicon layers 68, 72, and 76. As a result of this process, the polysilicon layer 68 is cut into separate sections 68a and 68b, the polysilicon layer 72 is cut into separate sections 72a and 72b, and the polysilicon layer 76 is cut into separate sections 76a and 76b. These sections 68a, 68b, 72a, 72b, 76a, 76b are to be used as branch-like conductive layers in the storage electrodes for the tree-type capacitor according to the invention.

Subsequently, wet etching is performed on the wafer, with the etching protection layer 22 as the etch end point, so as to remove the exposed insulating layers 70, 74. This completes the formation of the storage electrodes for the tree-type capacitor of DRAM cells in the wafer.

As shown in FIG. 5C, the thus formed storage electrodes are composed of the trunk-like polysilicon layers 26a, 26b, the upper branch-like polysilicon layers 76a, 76b, a pair of substantially L-shaped suspended branch-like polysilicon layers 72a, 72b, and another pair of substantially L-shaped suspended branch-like conductive layers 68a, 68b. The trunk-like polysilicon layers 26a, 26b are respectively electrically coupled to the drain regions 16a and 16b of the transfer transistors in the DRAM. The branch-like polysilicon layers 76a, 76b are connected to the top of the trunk-like polysilicon layers 26a, 26b and substantially arranged at right angles with respect to the same. The substantially L-shaped suspended branch-like polysilicon layers 72a, 72b each extend downwards from beneath the upper branch-like polysilicon layers 76a, 76b a predetermined distance and are then angled to extend horizontally. Each of the substantially L-shaped suspended branch-like polysilicon layers 68a, 68b have its topmost segment in contact with the top of the polysilicon pillars 26a, 26b, its two vertical segments set apart by the insulating spacers 66a, 66b with respect to the sidewalls of the polysilicon pillars 26a, 26b, and its two bottom-most horizontal segments in contact with the etching protection layer 22.

Fifth Preferred Embodiment

The fifth preferred embodiment of the invention includes a tree-type capacitor having two pairs of substantially L-shaped suspended branches, of which one pair of suspended branches nearest to the trunk-like conductive layer has vertical segments into contact with the sidewalls of the trunk-like conductive layer and horizontal segments set apart from the etching protection layer therebelow. This embodiment will be described below with reference to FIGS. 6A through 6D.

The tree-type capacitor of the fifth embodiment is based on the structure of FIG. 2A. Elements in FIGS. 6A through 6D that are identical to those in FIG. 2A are labeled with the same numerals.

Figure 6A:
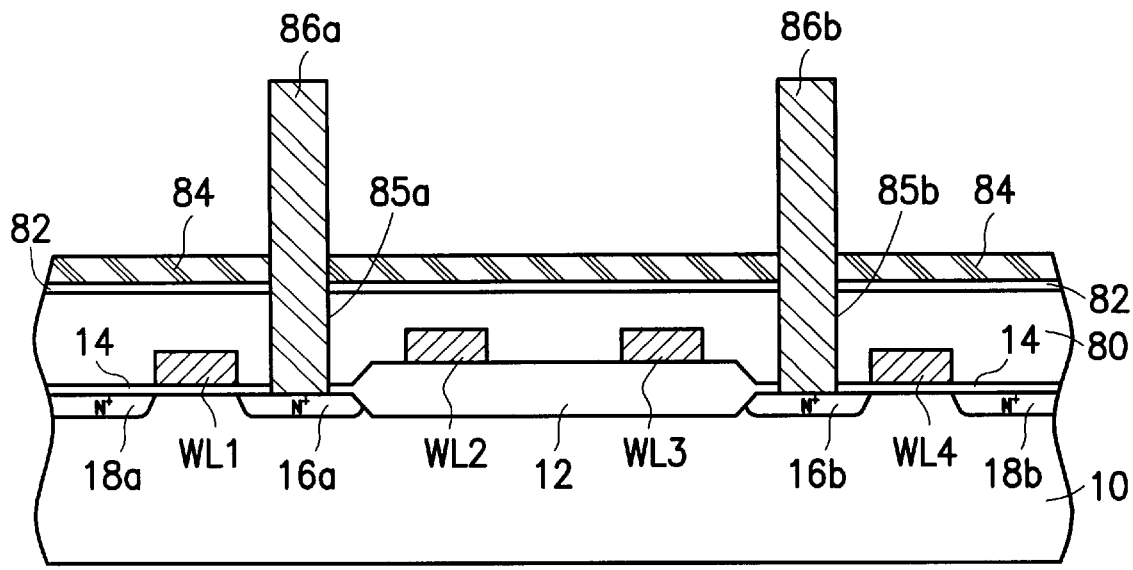
FIGS. 6A through 6D are cross-sectional views depicting the process steps for fabricating a fifth embodiment of a semiconductor memory cell having a tree-type capacitor according to the invention.

Referring first to FIG. 6A together with FIG. 2A, from the wafer of FIG. 2A, the CVD method is used to deposit a planarization insulating layer 80 such as a layer of borophosphosilicate glass (BPSG). Then the same method is used to form successively an etching protection layer 82, which is preferably a silicon nitride layer, and an insulating layer such as a silicon dioxide (SiO$_2$) layer 84 to a thickness of approximately 1,000 Å, for example. After that, a conventional photolithographic and etching process is used to define and etch away selected parts of the insulating layer (SiO$_2$) 84, the etching protection layer 82, and the planarization insulating layer 80. As a result of this process, there are formed storage electrode contact holes 85a, 85b which extend from the top surface of the insulating layer (SiO$_2$) 84 to the surface of the drain regions 16a, 16b. Subsequently, a thick polysilicon layer is deposited over the wafer to a thickness of 7,000 Å, for example. The thick polysilicon layer can be further diffused with impurities such as arsenic (As) ions so as to increase the conductivity thereof After that, a conventional photolithographic and etching process is performed on the thick polysilicon layer so as to define and form polysilicon pillars 86a, 86b which extend from the surface of the drain regions 16a, 16b upright through the storage electrode contact holes 85a, 85b.

Figure 6B:
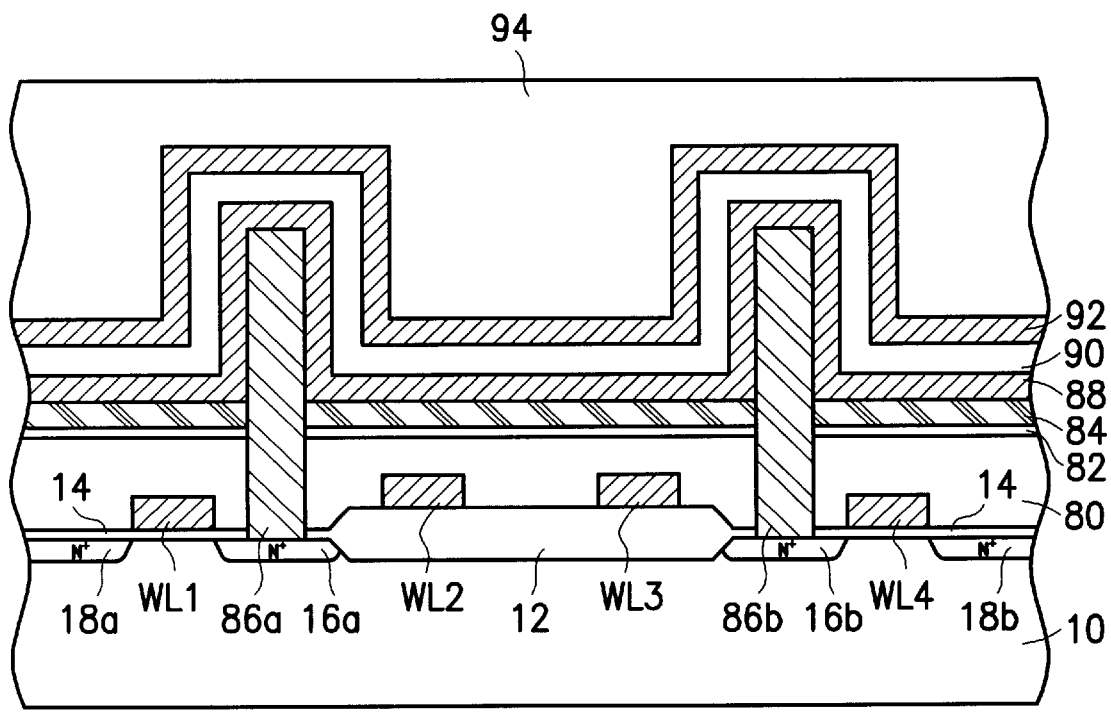

Referring next to FIG. 6B, in the subsequent step the CVD method is used successively to form alternate layers of insulation and polysilicon, including a first polysilicon layer 88, a first insulating layer 90, a second polysilicon layer 92, and a second insulating layer 94.

Figure 6C:
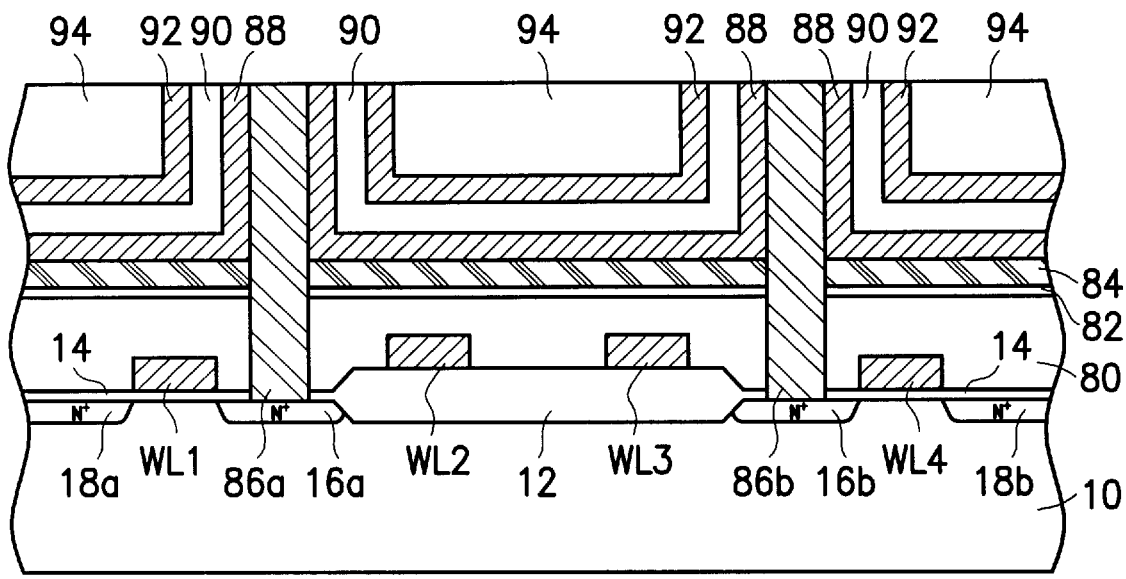

Referring next to FIG. 6C, in the subsequent step the CMP process is performed on the surface of the wafer of FIG. 6B, so as to polish away an upper part of the wafer until the surface of the topmost segment of the first polysilicon layer 88 is exposed or polish further down until the top of the polysilicon pillars 86a, 86b is exposed.

Figure 6D:
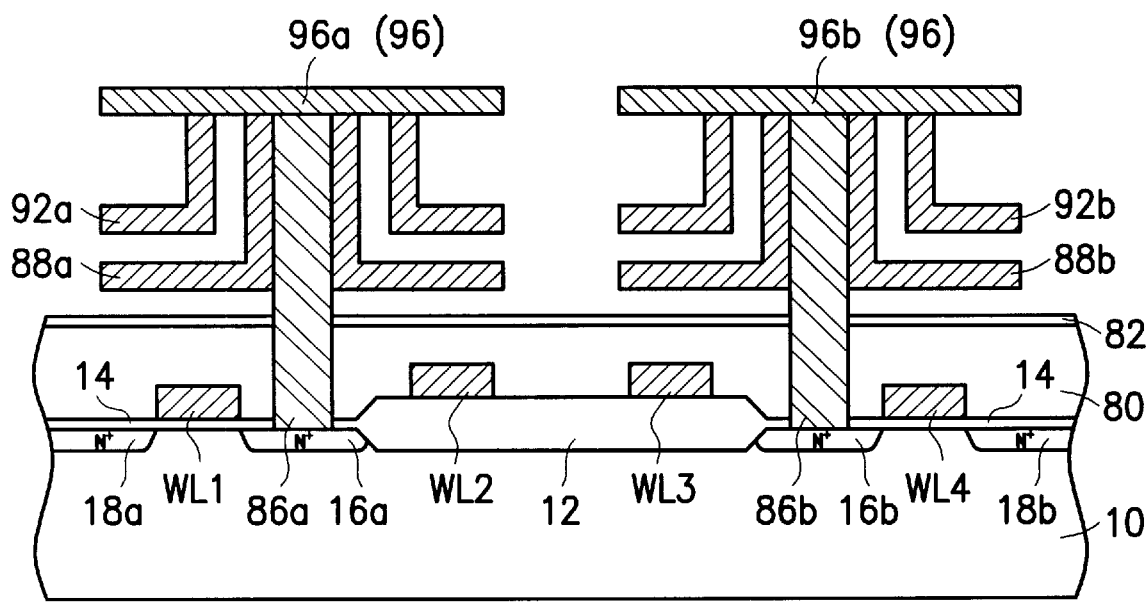

Referring next to FIG. 6D, in the subsequent step a polysilicon layer 96 is deposited over the wafer. After that, a conventional photolithographic and etching process is performed on the wafer to successively etch away selected parts of the polysilicon layers 88, 92, and 96. As a result of this process, the polysilicon layer 88 is cut into separate sections 88a and 88b, the polysilicon layer 92 is cut into separate sections 92a and 92b, and the polysilicon layer 96 is cut into separate sections 96a and 96b. These sections 88a, 88b, 92a, 92b, 96a, 96b are to be used as branch-like conductive layers in the storage electrodes for the tree-type capacitor according to the invention.

Subsequently, wet etching is performed on the wafer, with the etching protection layer 82 as the etch end point, so as to remove the exposed insulating layers 94, 90, and 84. This completes the formation of the storage electrodes for the tree-type capacitor of DRAM cells in the wafer.

As shown in FIG. 6D, the thus formed storage electrodes includes the trunk-like polysilicon layers 86a, 86b, the upper branch-like polysilicon layers 96a, 96b, and two pairs of substantially L-shaped suspended branch-like polysilicon layers 88a, 92a and 88b, 92b. The trunk-like polysilicon layers 86a, 86b are respectively electrically coupled to the drain regions 16a and 16b of the transfer transistors in the DRAM. The upper branch-like polysilicon layers 96a, 96b are connected to the top of the trunk-like polysilicon layers 86a, 86b and substantially arranged at right angles with respect to the same. The two pairs of substantially L-shaped suspended branch-like polysilicon layers 88a, 92a and 88b, 92b each extends downwards from beneath the branch-like polysilicon layers 96a, 96b a predetermined distance and are then angled to extend horizontally. Further, the substantially L-shaped suspended branch-like polysilicon layers 88a, 88b each has its vertical segment in contact with the sidewalls of the trunk-like polysilicon layers 86a, 86b and has its horizontal segment set apart from the etching protection layer 82.

Sixth Preferred Embodiment

In the foregoing embodiments, the suspended branches are each substantially L-shaped and composed of two straight segments connected at a right angle to each other. However, the invention is not limited to such a structure and the suspended branches can be composed of three or more segments. The sixth embodiment of the invention includes a tree-type capacitor having a suspended branch-like conductive layer composed of four segments, which will be described below with reference to FIGS. 7A through 7E.

The tree-type capacitor of the sixth embodiment is based on the structure of FIG. 2A. Elements in FIGS. 7A through 7E that are identical to those in FIG. 2A are labeled with the same numerals.

Figure 7A:
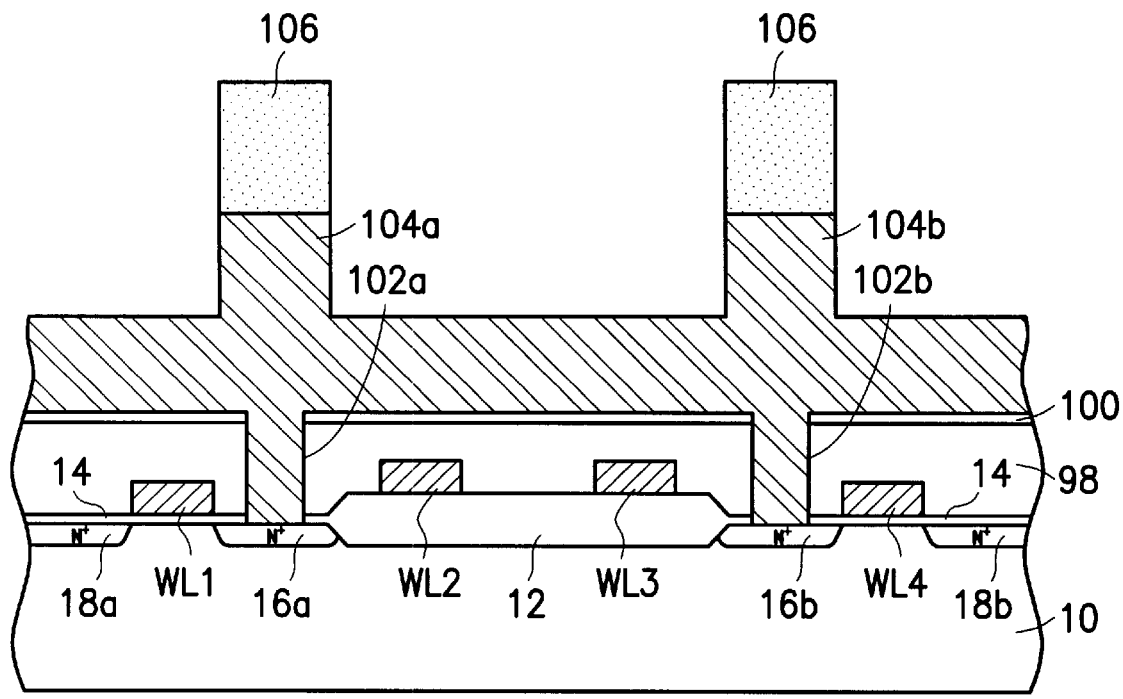
FIGS. 7A through 7E are cross-sectional views depicting the process steps for fabricating a sixth embodiment of a semiconductor memory cell having a tree-type capacitor according to the invention.

Referring to FIG. 7A together with FIG. 2A, the wafer of FIG. 2A is subjected to the CVD method to deposit a planarization insulating layer 98 such as a layer of borophosphosilicate glass (BPSG). Then the same method is used to form an etching protection layer 100 such as a silicon nitride layer. After that, a conventional photolithographic and etching process is used to define and etch away selected parts of the etching protection layer 100 and the planarization insulating layer 98 so as to form storage electrode contact holes 102a, 102b which extend from the top surface of the etching protection layer 100 to the surface of the drain regions 16a, 16b. Subsequently, a thick polysilicon layer 104 is deposited over the wafer to a thickness of 7,000 Å, for example. The thick polysilicon layer can be further diffused with impurities such as arsenic ions so as to increase the conductivity thereof. After that, a conventional photolithographic process is used to form a photoresist layer 106 which is used as mask to etch the exposed part of the thick polysilicon layer. As a result of this, there are formed protruding polysilicon layers 104a, 104b which extend from the surface of the drain regions 16a, 16b upright through the storage electrode contact holes 102a, 102b.

Figure 7B:
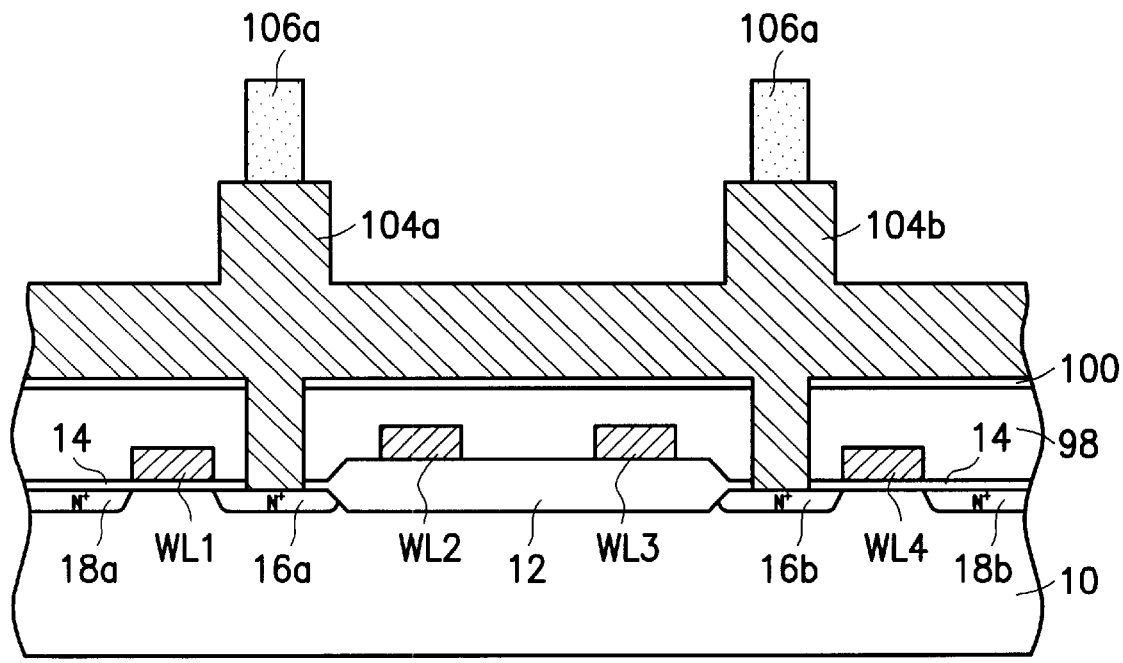

Referring next to FIG. 7B, in the subsequent step a photoresist erosion technique is used to remove a surface part of the photoresist layer 106, leaving a thinned photoresist layer 106a. This also allows an edge part of the protruding polysilicon layers 104a, 104b to be exposed.

Figure 7C:
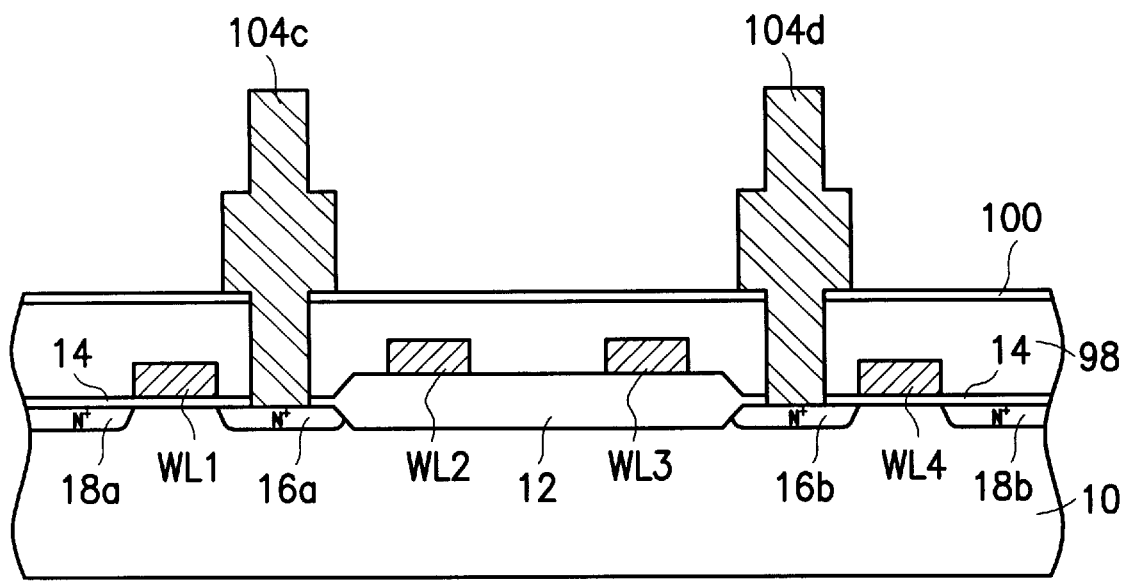

Referring next to FIG. 7C, in the subsequent step an anisotropic etching process is performed on the wafer until the etching protection layer 100 is exposed. After that, the photoresist layer 106a is removed. As a result of this process, the protruding polysilicon layers 104a, 104b are each formed into layers 104c, 104d having a shape with staircase-like sidewalls 104e. In this embodiment, the staircase-like sidewalls 104e are each formed with at least a shoulder-like portion 104f.

Figure 7D:
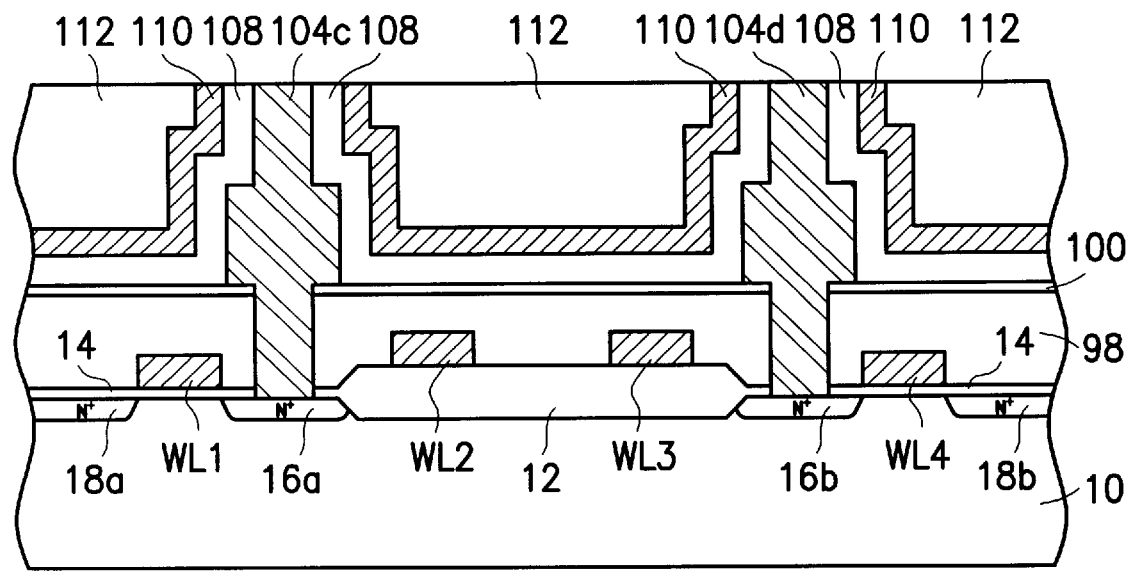

Referring next to FIG. 7D, the subsequent steps are substantially the same as those used to form the wafer of FIGS. 2C and 2D. First, the CVD method is used successively to form a first insulating layer 108, a polysilicon layer 110, and a second insulating layer 112. After that, the CMP process is performed on the wafer, so as to polish away an upper part of the wafer until the top of the protruding polysilicon layers 104c, 104d is exposed.

Figure 7E:
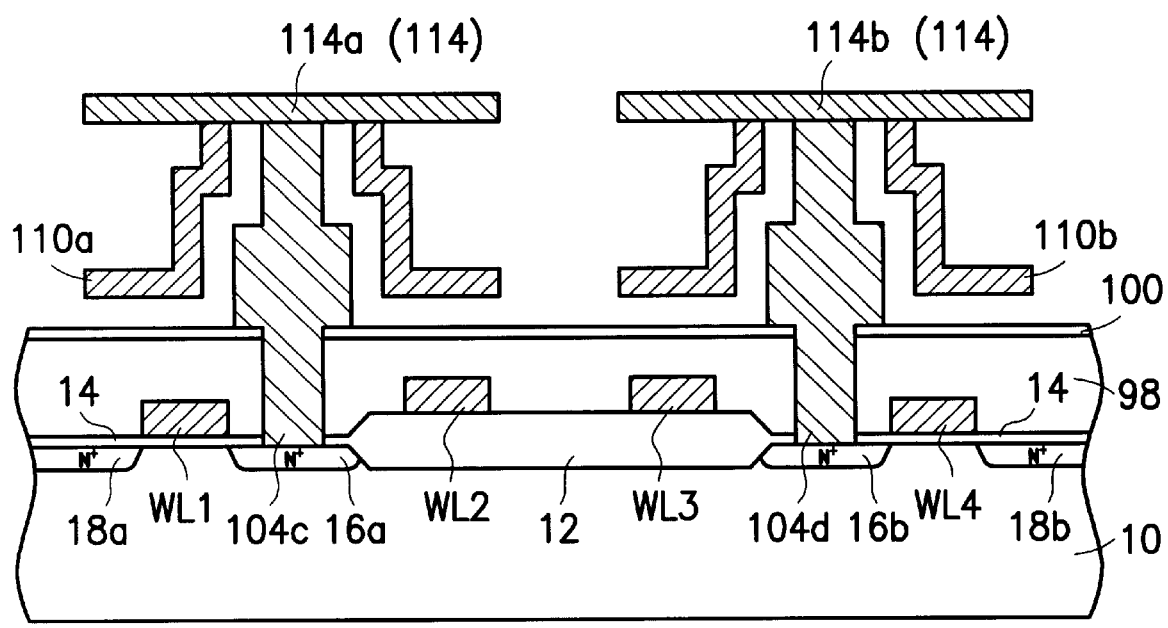

Referring next to FIG. 7E, in the subsequent step a polysilicon layer 114 is deposited over the wafer to a thickness of approximately 1,000 Å, for example. The polysilicon layer 114 can be diffused with impurities such as arsenic (As) ions so as to increase the conductivity thereof. After that, a conventional photolithographic and etching process is performed on the wafer, so as to define and etch away selected parts of the polysilicon layer 114, the second insulating layer 112, and the polysilicon layer 110. As a result of this process, the polysilicon layer 114 is cut into separate sections 114a and 114b and the polysilicon layer 110 is cut into separate sections 110a and 110b. These sections 114a, 114b and 110a, 110b are to be used as branch-like conductive layers in the storage electrodes for the tree-type capacitor according to the invention.

Subsequently, wet etching is performed on the wafer with the etching protection layer 100 as the etch end point, so as to remove the exposed insulating layers 112, 108. This completes the formation of the storage electrodes for the tree-type capacitor of DRAM cells in the wafer.

As shown in FIG. 7E, the thus formed storage electrodes are composed of the trunk-like protruding polysilicon layers 104c, 104d, the upper branch-like polysilicon layers 114a, 114b, and two pairs of four-segment, suspended branch-like polysilicon layers 110a, 101b. The trunk-like protruding polysilicon layers 104c, 104d are respectively electrically coupled to the drain regions 16a and 16b of the transfer transistors in the DRAM. The upper branch-like polysilicon layers 114a, 114b are connected to the top of the trunk-like protruding polysilicon layers 104c, 104d and substantially arranged at right angles with respect to the same. The four-segment, suspended branch-like polysilicon layers 110a, 110b each extend downwards from beneath the branch-like polysilicon layers 114a, 114b with four substantially straight segments.

In accordance with the invention, the multi-segment suspended branch-like polysilicon layers are not limited to the foregoing disclosed four-segment branches. Should five or more segments be desired, photoresist erosion and anisotropic etching can be performed repeatedly on the wafer of FIGS. 7B and 7C so as to shape the sidewalls of the protruding polysilicon layers with more shoulder-like portions.

Seventh Preferred Embodiment

In the foregoing six embodiments, the CMP process is used to cut polysilicon layers into separate sections. However, the invention is not limited to the use of the CMP process. Alternatively, conventional photolithographic and etching processes can be used to cut the same polysilicon layers into separate sections. The use of such processes is described below with reference to FIGS. 8A through 8E.

The tree-type capacitors of the seventh embodiment are based on the structure of FIG. 2B. Elements in FIGS. 8A through 8E that are identical to those in FIG. 2B are labeled with the same numerals.

Figure 8A:
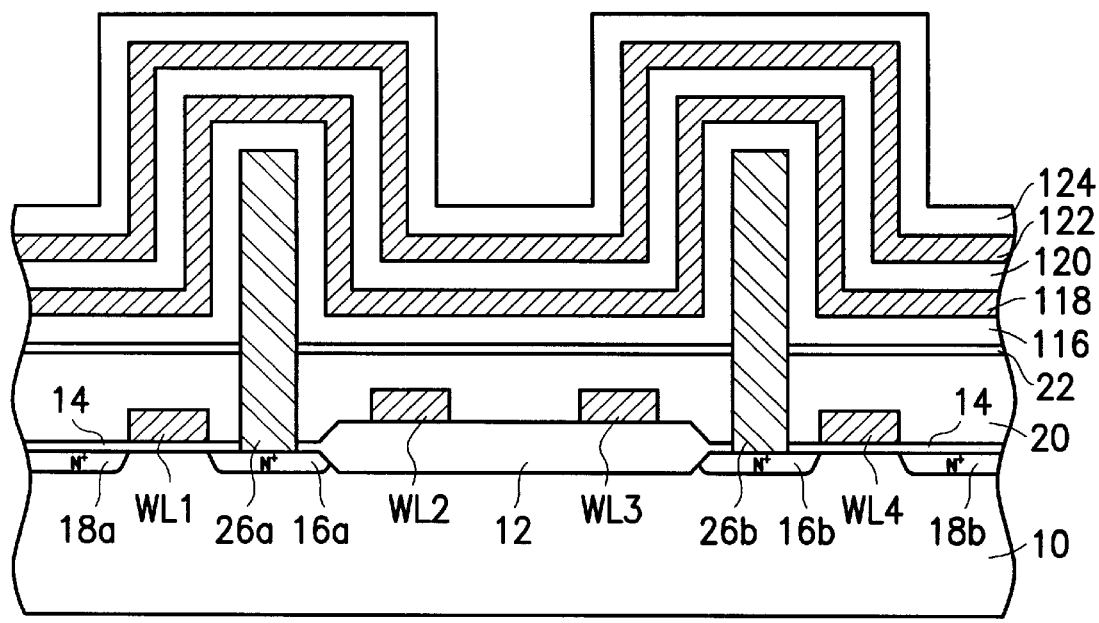
FIGS. 8A through 8E are cross-sectional views depicting the process steps for fabricating a seventh embodiment of a semiconductor memory cell having a tree-type capacitor according to the invention.

Referring first to FIG. 8A together with FIG. 2B starting with the wafer of FIG. 2B the CVD method is used to form successively a first insulating layer 116, a first polysilicon layer 118, a second insulating layer 120, a second polysilicon layer 122, and a third insulating layer 124, each of which is deposited to a thickness of about 1,000 Å, for example. The insulating layers 116, 120, 124 are each preferably silicon dioxide ($SiO_2$) layers. Further, the polysilicon layers 118, 122 can be diffused with impurities such as arsenic (As) ions so as to increase the conductivity thereof.

Figure 8B:
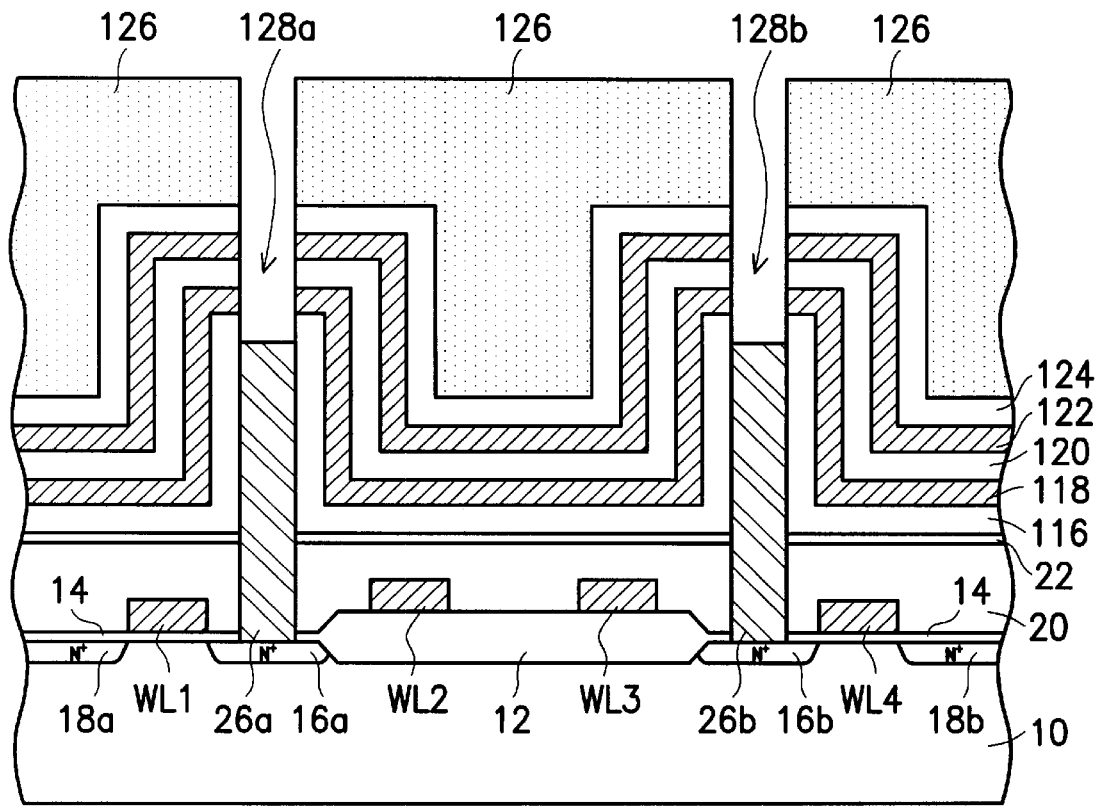

Referring next to FIG. 8B, in the subsequent step a conventional photolithographic process is used to form a photoresist layer 126 over the wafer. After that, anisotropic etching is performed on the wafer so as to successively etch away exposed parts of the third insulating layer ($SiO_2$) 124, the second polysilicon layer 122, the second insulating layer ($SiO_2$) layer 120, the first polysilicon layer 118, and the first insulating layer ($SiO_2$) layer 116, until the top of the polysilicon pillars 26a, 26b is exposed. As a result of this process, storage electrode contact holes 128a, 128b are formed, which extend from the top surface of the photoresist layer 126 to the top of the polysilicon pillars 26a, 26b, thereby cutting the insulating layers ($SiO_2$) 116, 120, 124 and the polysilicon layers 118, 122 into separate sections. After that, the photoresist layer 126 is removed.

Figure 8C:
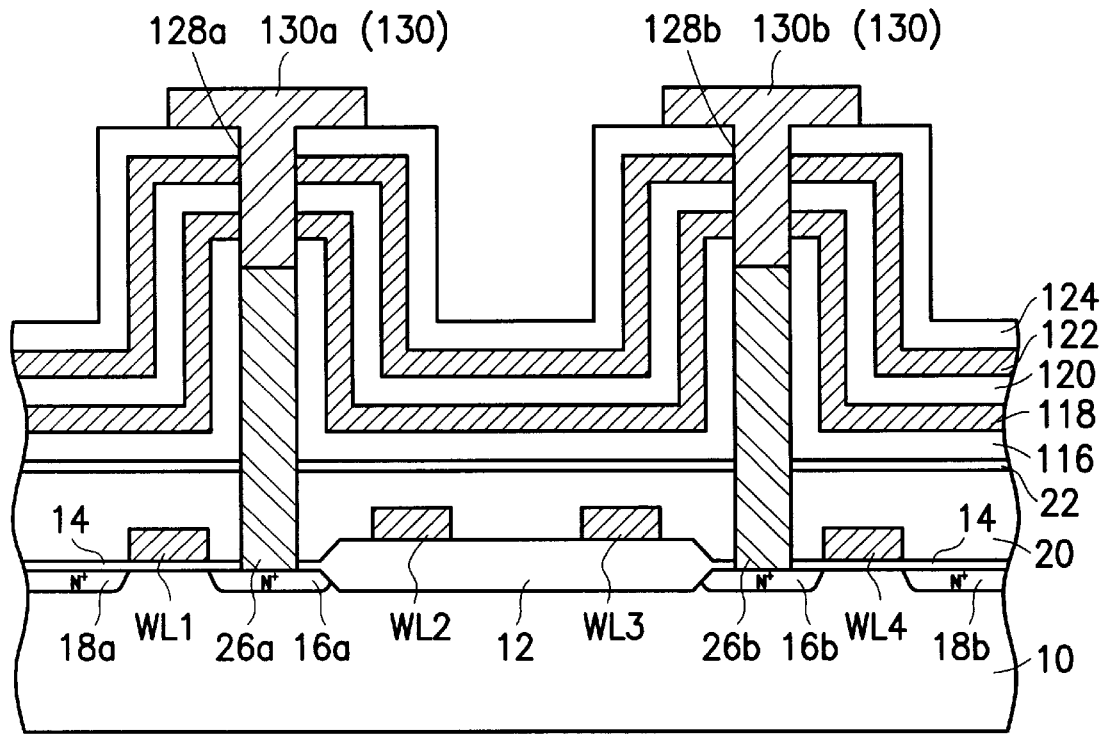

Referring next to FIG. 8C, in the subsequent step a polysilicon layer 130 is deposited over the wafer so as to fill up the storage electrode contact holes 128a, 128b. After that, a conventional photolithographic and etching process is used to define and form two substantially T-shaped polysilicon layers 130a, 130b which are connected to the top of the polysilicon pillars 26a, 26b. In this embodiment, the T-shaped polysilicon layers 130a, 130b and the polysilicon pillars 26a, 26b in combination constitute the trunk-like conductive layer in the tree-type capacitor according to the present invention.

Alternatively, the polysilicon can be refilled into the storage electrode contact holes 128a, 128b to form pillar-like conductive layers. Preferably, the refilling process includes a first step of depositing a polysilicon layer by the CVD method and a second step of etching back the polysilicon layer; or alternatively the refilling process includes a first step of depositing a polysilicon layer only to a predetermined thickness on the inner wall of the storage electrode contact holes 128a, 128b (which are not filled up by the polysilicon layer), and a second step of performing a conventional photolithographic and etching process on the wafer so as to form U-shaped conductive layers on top of the polysilicon pillars 26a, 26b.

Figure 8D:
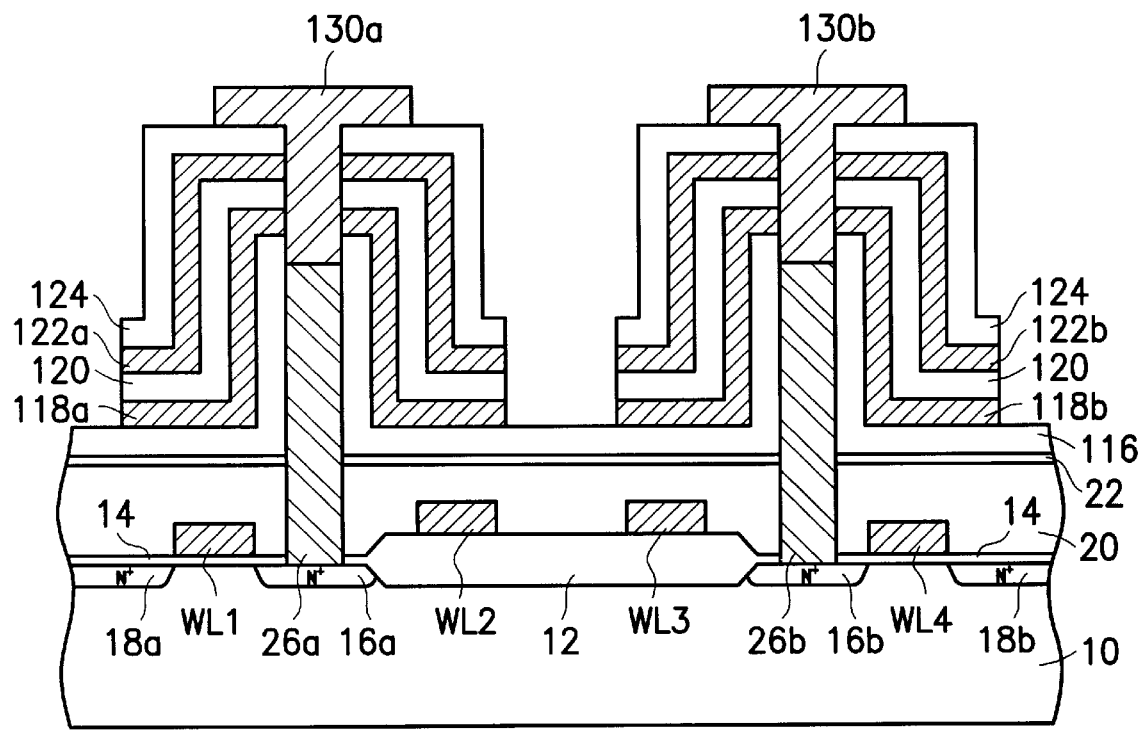

Referring next to FIG. 8D, in the subsequent step a conventional photolithographic and etching process is used to define and etch away selected parts of the third insulating layer ($SiO_2$) 124, the second polysilicon layer 122, the second insulating layer ($SiO_2$) 120, and the first polysilicon layer 118. As a result of this process, the polysilicon layer 118 is cut into separate sections 118a and 118b and the polysilicon layer 122 is cut into separate sections 122a and 122b. These sections 118a, 118b and 122a, 122b are to be used as branch-like conductive layers in the storage electrodes for the tree-type capacitor according to the invention.

Figure 8E:
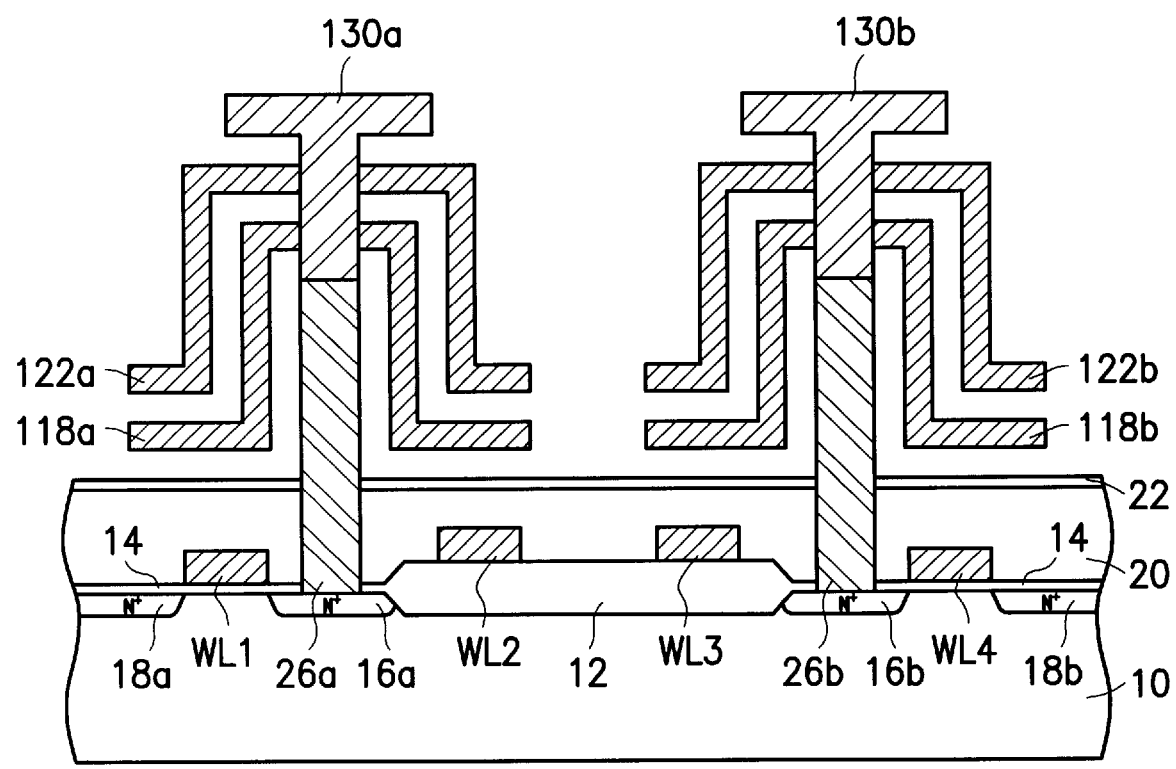

Referring next to FIG. 8E, in the subsequent step wet etching is performed on the wafer, with the etching protection layer 22 as the etch end point, so as to remove the exposed insulating layers ($SiO_2$) 124, 120, 116. This completes the formation of the storage electrodes for the tree-type capacitor of DRAM cells in the wafer.

As shown in FIG. 8E, the thus formed storage electrodes are composed of the pillar-shaped trunk-like polysilicon layers 26a, 26b, the substantially T-shaped trunk-like polysilicon layers 130a, 130b, and two pairs of three-segment suspended branch-like polysilicon layers 118a, 122a and 118b, 122b. The pillar-shaped trunk-like polysilicon layers 26a, 26b are respectively electrically coupled to the drain regions 16a and 16b of the transfer transistors in the DRAM. The substantially T-shaped trunk-like polysilicon layers 130a, 130b are connected to the top of the pillar-shaped trunk-like polysilicon layers 26a, 26b. The two pairs of the three-segment suspended branch-like polysilicon layers 118a, 122a and 118b, 122b are each connected to the vertical segment of the substantially T-shaped trunk-like polysilicon layers 130a, 130b.

Eighth Preferred Embodiment

The eighth embodiment of the invention is similar in structure to the foregoing seventh embodiment, except the substantially T-shaped trunk-like conductive layer is herein modified to a pillar-shaped trunk having a hollowed interior. This embodiment is described below with reference to FIGS. 9A and 9B.

The tree-type capacitor of the eighth embodiment is based on the structure of FIG. 8B. Elements in FIGS. 9A and 9B that are identical to those in FIG. 8B are labeled with the same numerals.

Figure 9A:
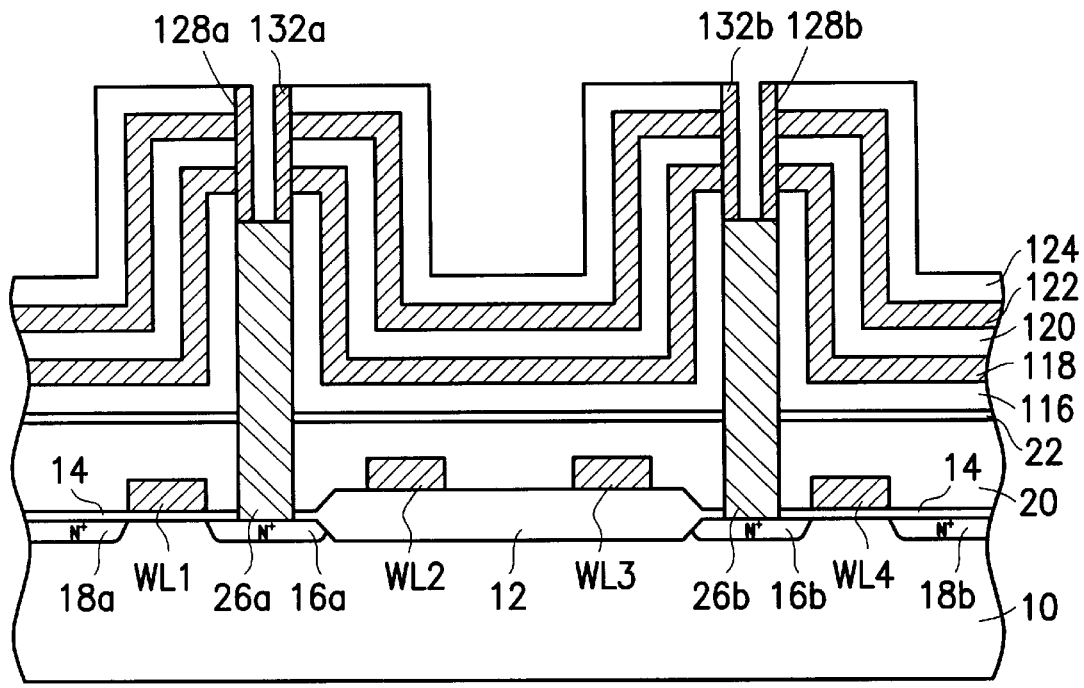
FIGS. 9A and 9B are cross-sectional views depicting the process steps for fabricating an eighth embodiment of a semiconductor memory cell having a tree-type capacitor according to the invention.

Referring first to FIG. 9A together with FIG. 8B, the CVD method is used to deposit on the wafer of FIG. 8B a polysilicon layer which is then etched back to form sidewall spacers 132a, 132b on the inner wall of the storage electrode contact holes 128a, 128b. These sidewall spacers 132a, 132b each constitute a pillar-shaped trunk-like conductive layer which is connected to the top of the polysilicon pillars 26a, 26b.

Figure 9B:
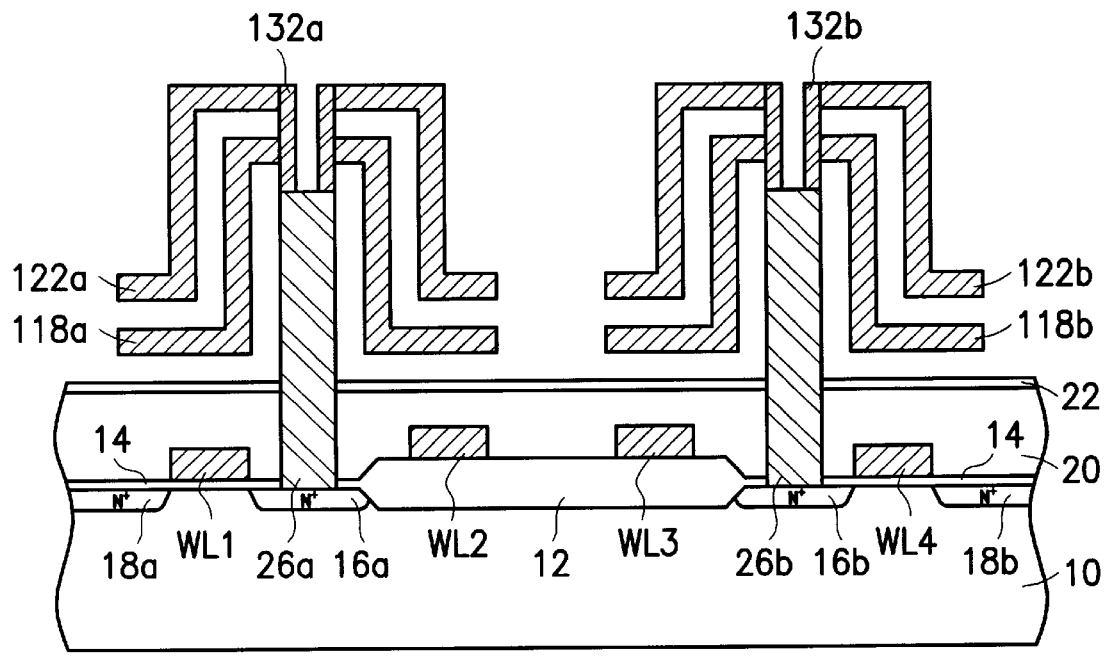

Referring next to FIG. 9B, in the subsequent step a conventional photolithographic and etching process is used to define and etch away selected parts of the third insulating layer 124, the second polysilicon layer 122, the second insulating layer 120, and the first polysilicon layer 118. As a result of this process, the polysilicon layer 118 is cut into separate sections 118a and 118b, and the polysilicon layer 122 is cut into separate sections 122a and 122b. These sections 118a, 118b and 122a, 122b are to be used as branch-like conductive layers in the storage electrodes for the tree-type capacitor according to the invention.

Subsequently, wet etching is performed on the wafer with the etching protection layer 22 as the etch end point, so as to remove the exposed insulating layers ($SiO_2$) 124, 120, and 116. This completes the formation of the storage electrodes for the tree-type capacitor of DRAM cells in the wafer.

As shown in FIG. 9B, the thus formed storage electrodes are composed of the pillar-shaped trunk-like polysilicon layers 26a, 26b, the also pillar-shaped trunk-like polysilicon layers 132a, 132b which each have a hollowed interior, and two pairs of three-segment branch-like polysilicon layers 118a, 122b and 118b, 122b. This embodiment differs from the previous embodiment shown in FIG. 8E only in that the T-shaped trunk-like polysilicon layers 130a, 130b are replaced by the pillar-shaped trunk-like polysilicon layers 132a, 132b each having a hollowed interior.

Ninth Preferred Embodiment

The ninth embodiment is a tree-type capacitor having a T-shaped trunk-like conductive layer, which will be described below with reference to FIGS. 10A through 10E.

The tree-type capacitor of the ninth embodiment is based on the wafer structure of FIG. 2A. Elements in FIGS. 10A through 10E that are identical to those in FIG. 2A are labeled with the same numerals.

Figure 10A:
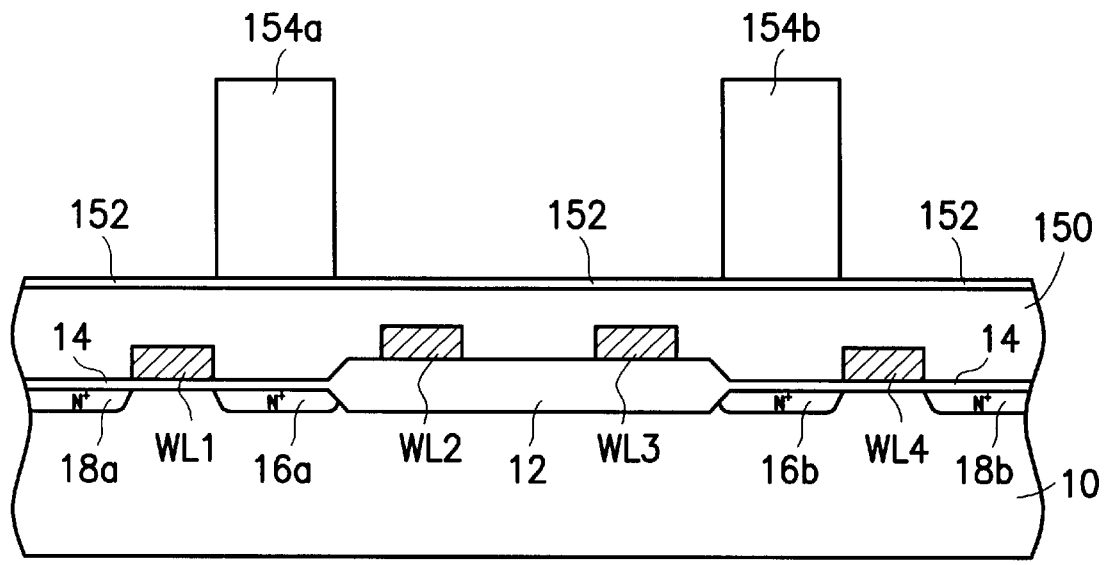
FIGS. 10A through 10E are cross-sectional views depicting the process steps for fabricating a ninth embodiment of a semiconductor memory cell having a tree-type capacitor according to the invention.

Referring first to FIG. 10A together with FIG. 2A, the CVD method is used to deposit on the wafer of FIG. 2A a planarization insulating layer 150 such as a layer of borophosphosilicate glass (BPSG). Then the same method is used to form an etching protection layer 152 such as a silicon nitride layer. Subsequently, a thick insulating layer such as a silicon dioxide ($SiO_2$) layer, is deposited over the wafer to a thickness of about 7,000 Å, for example. After that, a conventional photolithographic and etching process is used to define and form insulating pillars 154a, 154b which are located substantially above the drain regions 16a, 16b.

Figure 10B:
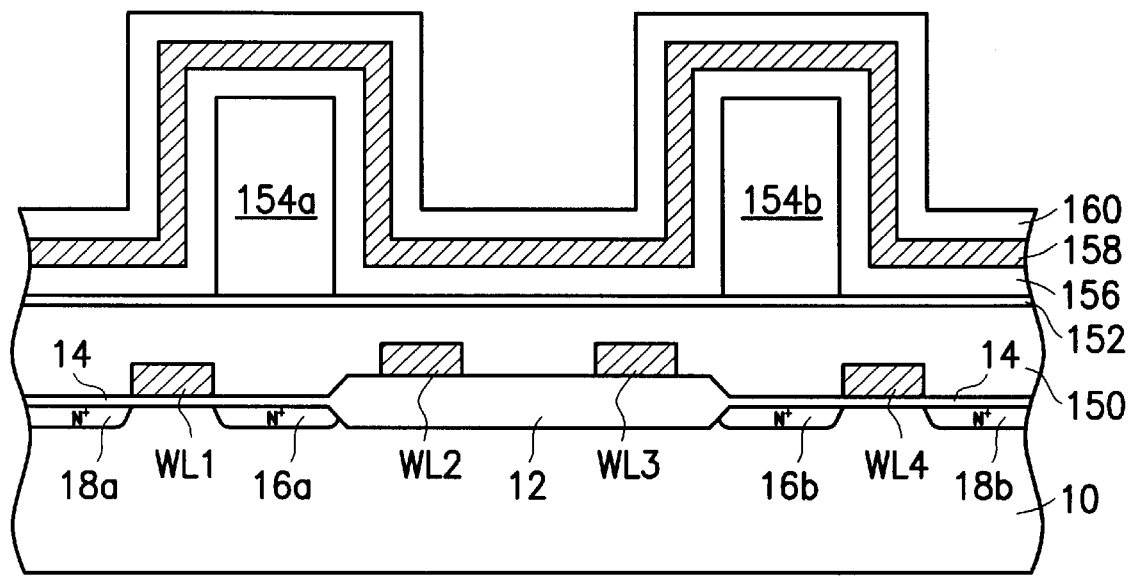

Referring next to FIG. 10B, in the subsequent step the CVD method is used to form successively a first insulating layer 156, a first polysilicon layer 158, and a second insulating layer 160, each of which is deposited to a thickness of about 1,000 Å, for example. The insulating layers 156, 160 are each preferably silicon dioxide ($SiO_2$) layers. Further, the polysilicon layer 158 can be diffused with impurities such as arsenic (As) ions so as to increase the conductivity thereof.

Figure 10C:
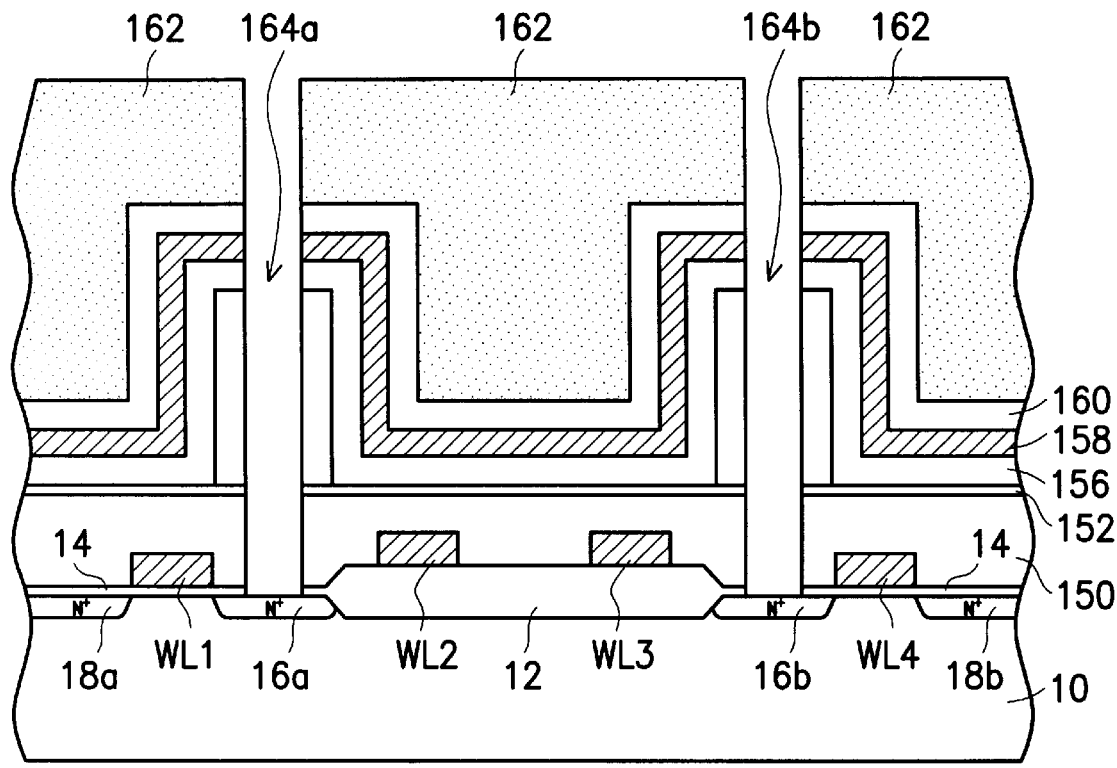

Referring next to FIG. 10C, in the subsequent step a conventional photolithographic process is used to form a photoresist layer 162 over the wafer. After that, anisotropic etching is performed on the wafer, so as to etch away exposed parts of the second insulating layer ($SiO_2$) 160, the first polysilicon layer 158, the first insulating layer ($SiO_2$) 156, the insulating pillars 154a, 154b, the etching protection layer 152, the planarization insulating layer 150, and the gate oxidation film 14, until the top surface of the drain regions 16a, 16b is exposed. As a result of this process, there are formed storage electrode contact holes 164a, 164b which extend from the top surface of the drain regions 16a, 16b to the top surface of the second insulating layer 160.

Figure 10D:
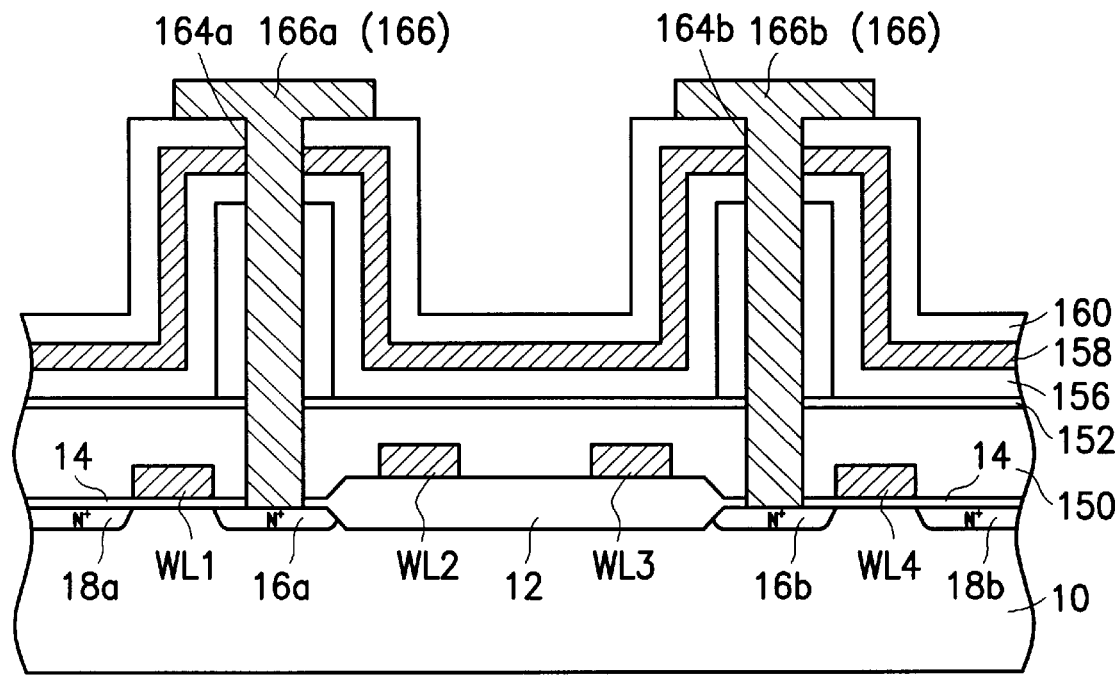

Referring next to FIG. 10D, in the subsequent step a polysilicon layer 166 which fills up the storage electrode contact holes 164a, 164b is deposited over the wafer. After that, a conventional photolithographic and etching process is used to define and form the polysilicon layer 166 into two substantially T-shaped trunk-like conductive layers 166a, 166b which are electrically connected to drain regions 16a, 16b.

Figure 10E:
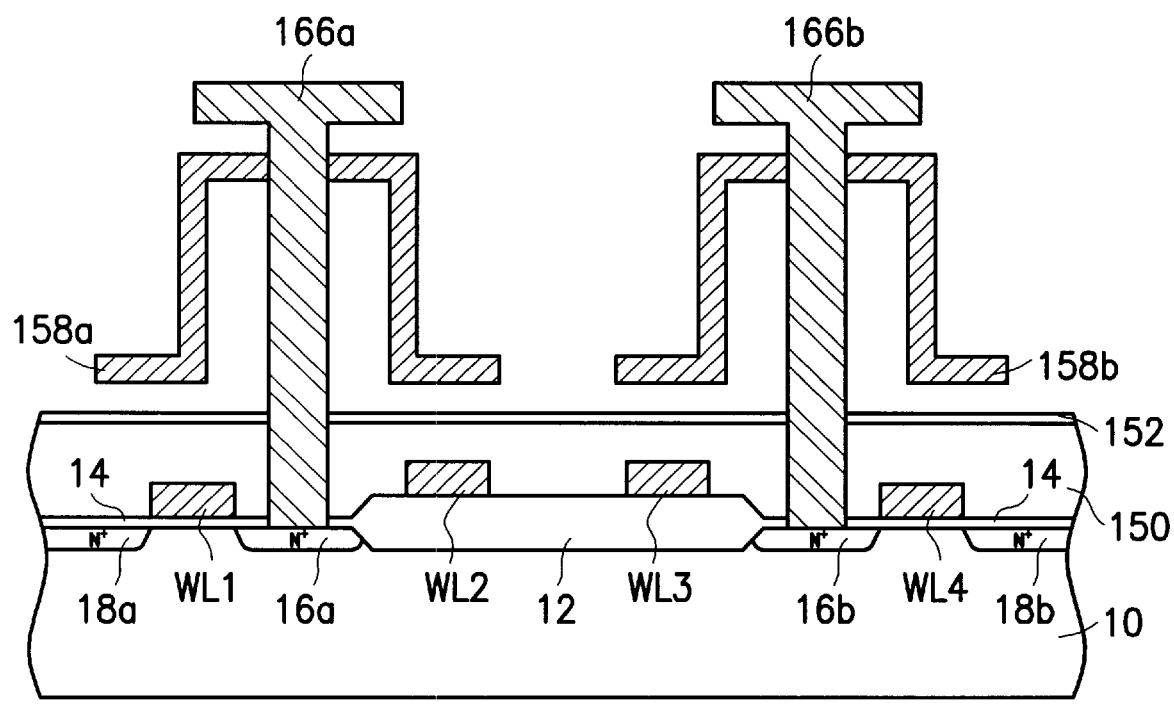

Referring next to FIG. 10E, in the subsequent step a conventional photolithographic and etching process is performed on the wafer so as to define and etch away selected parts of the second insulating layer 160 and the first polysilicon layer 158. As a result of this process, the polysilicon layer 158 is cut into separate sections 158a and 158b. These sections 158a, 158b are to be used as branch-like conductive layers in the storage electrodes for the tree-type capacitor according to the invention.

Subsequently, wet etching is performed on the wafer, with the etching protection layer 152 as the etch end point, so as to remove the exposed insulating layers (SiO₂) 160, 156 and the remaining part of the insulating pillars 154a, 154b. This completes the formation of the storage electrodes for the tree-type capacitor of DRAM cells in the wafer.

As shown in FIG. 10E, the thus formed storage electrodes are composed of the substantially T-shaped trunk-like polysilicon layers 166a, 166b and the three-segment suspended branch-like polysilicon layers 158a, 158b.

Tenth Preferred Embodiment

The tenth embodiment is substantially similar in structure to the above-disclosed ninth embodiment, except that the substantially T-shaped trunk-like conductive layers are hollowed so as to increase the charge storage area. This embodiment is described below with reference to FIGS. 11A and 11B.

The tree-type capacitor of the ninth embodiment is based on the structure shown in FIG. 10C. Elements in FIGS. 11A and 11B that are identical to those in FIG. 10C are labeled with the same numerals.

Figure 11A:
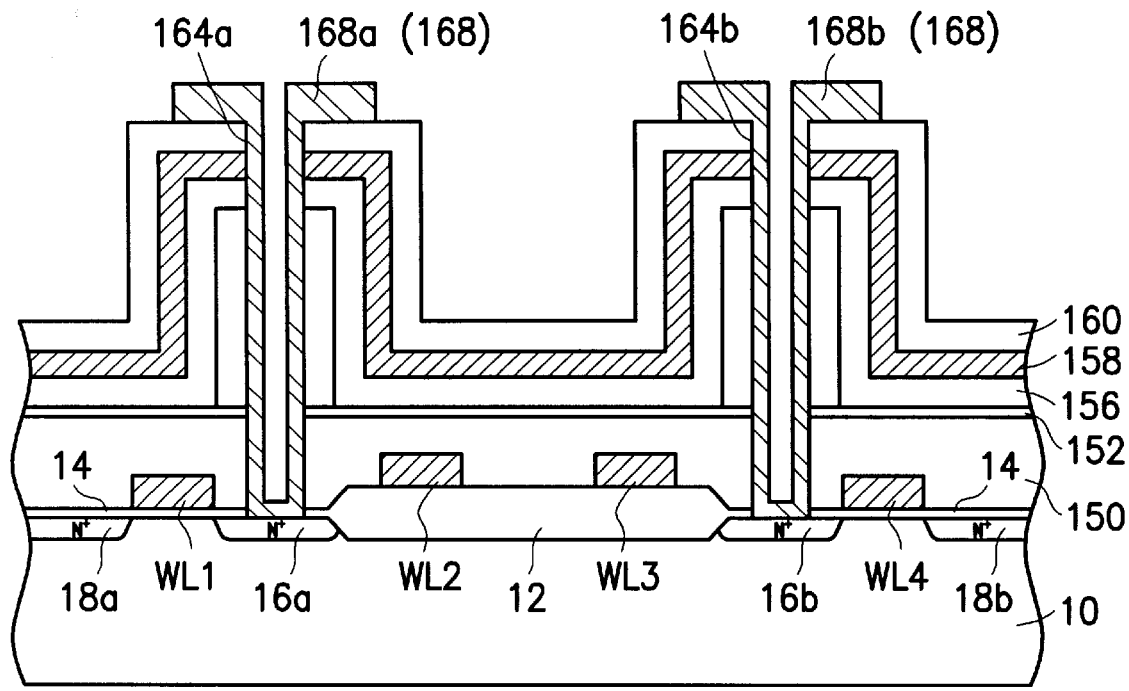
FIGS. 11A and 11B are cross-sectional views depicting the process steps for fabricating a tenth embodiment of a semiconductor memory cell having a tree-type capacitor according to the invention.

Referring first to FIG. 11A together with FIG. 10C, the CVD method is used to deposit on the wafer of FIG. 10C a polysilicon layer 168 in such a manner that, on the inner walls of the storage electrode contact holes 164a, 164b the polysilicon layer 168 is deposited only to a specific thickness that still provides a hollowed interior in the storage electrode contact holes 164a, 164b. After that, a conventional photolithographic and etching process is used to define and etch away selected parts of the polysilicon layer 168. As a result of this process, the remaining polysilicon layers 168a and 168b each serve as a substantially T-shaped trunk-like conductive layer having a hollowed interior for the storage electrode.

Figure 11B:
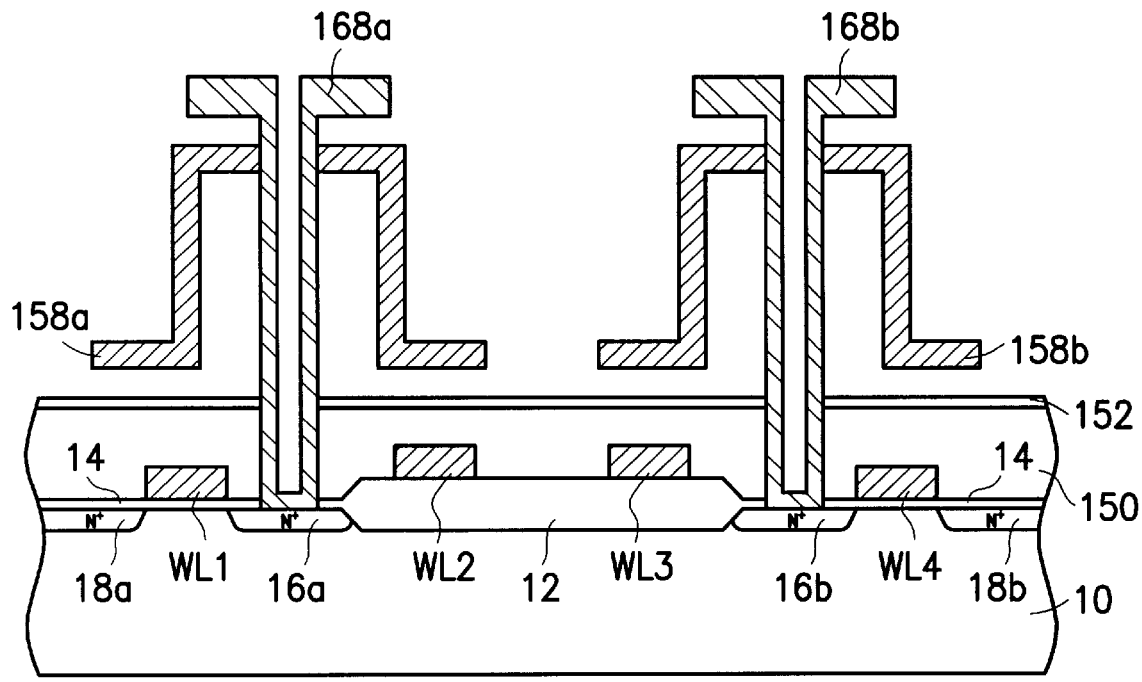

Referring next to FIG. 11B, in the subsequent step a conventional photolithographic and etching process is performed on the wafer to define and etch away selected parts of the second insulating layer 160 and first polysilicon layer 158. As a result of this process, the polysilicon layer 158 is cut into separate sections 158a and 158b. These sections 158a, 158b are to be used as branch-like conductive layers in the storage electrodes for the tree-type capacitor according to the invention.

Subsequently, wet etching is performed on the wafer, with the etching protection layer 152 as the etch end point, so as to remove the exposed insulating layers (SiO₂) 160, 156, and the remaining part of the insulating pillars 154a, 154b. This completes the formation of the storage electrodes for the tree-type capacitor of DRAM cells in the wafer.

As shown in FIG. 11B, the thus formed storage electrodes are composed of the substantially T-shaped trunk-like polysilicon layers 168a, 168a each having a hollowed interior and the three-segment suspended branch-like polysilicon layers 158a, 158b. The embodiment shown in FIG. 11B is substantially similar to the previous embodiment shown in FIG. 10E, except that the substantially T-shaped trunk-like polysilicon layers 166a, 166b in the previous embodiment is replaced by the substantially T-shaped trunk-like polysilicon layers 168a, 168a which each have a hollowed interior.

In this tenth and the above-described ninth embodiment, the pillar-like insulating layers can be formed in other shapes by various means. For example, the photoresist erosion technique can be used to form insulating layers having staircase-like sidewalls. Also, instead of the structure shown in FIG. 10A, if isotropic etching such as wet etching instead of anisotropic etching is used, the thick insulating layer can be reshaped into a substantially triangular shape; and if sidewall spacers are formed on the inner wall of the insulating pillars 154a, 154b, pillar-like insulating layers of other shapes can be obtained. The branch-like conductive layer can thus be formed into various shapes depending on the design choice.

Similarly, the pillar-like polysilicon layers can be formed with other shapes by various means so as to increase the surface area thereof. For example, in the case of FIG. 2B, if isotropic etching is used instead of the anisotropic etching, the thick polysilicon layers can be reshaped into a substantially triangular shape.

Eleventh Preferred Embodiment

In the foregoing first through tenth embodiments, the tree-type capacitor includes only one level of storage electrodes. However, the number of tree levels is not limited to one and can be two or more. The eleventh embodiment includes a tree-type capacitor having two levels of storage electrodes including a top level of storage electrodes stacked on a bottom level of storage electrodes, which will be described below with reference to FIGS. 12A through 12C.

The tree-type capacitor of the eleventh embodiment is based on the wafer structure of FIG. 3B. Elements in FIGS. 12A through 12C that are identical to those in FIG. 3B are labeled with the same numerals. The storage electrodes of the wafer shown in FIG. 3B are used as the bottom level of storage electrodes. The following description is directed only to the formation of the top level of storage electrodes which is stacked directly above the bottom level of storage electrodes.

Figure 12A:
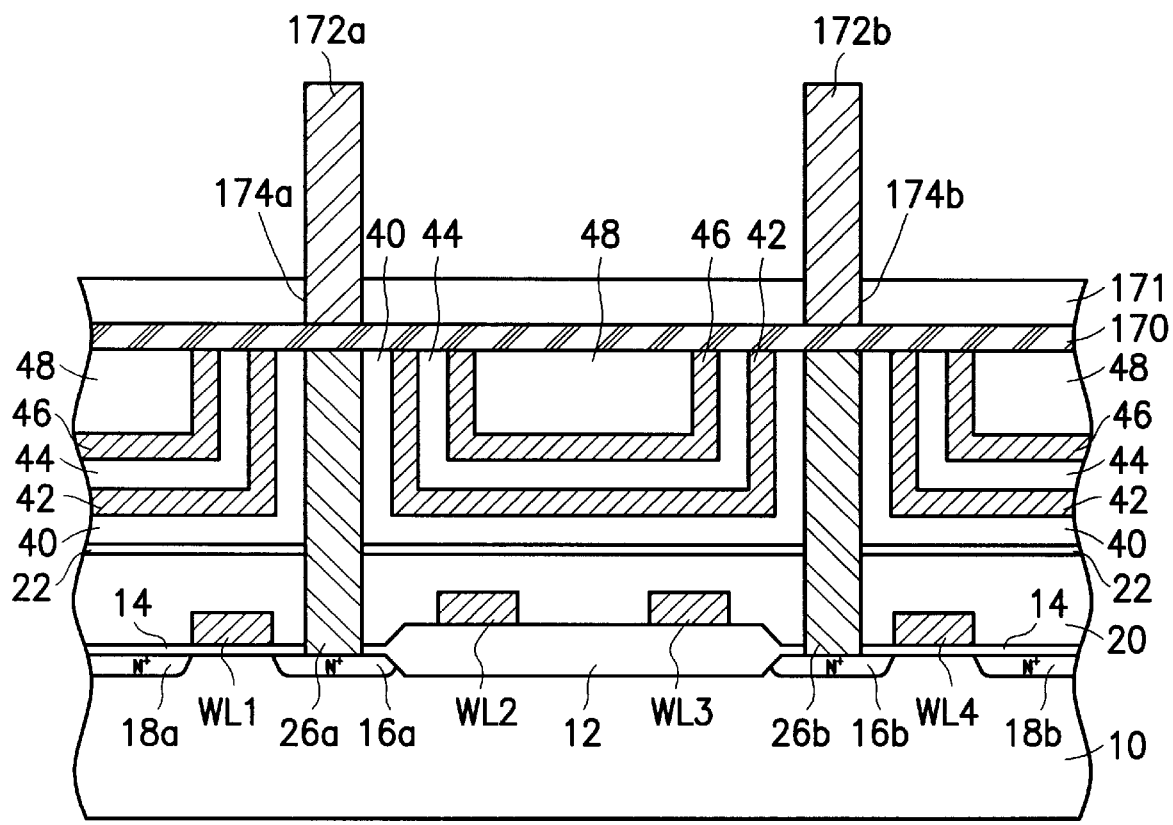
FIGS. 12A through 12C are cross-sectional views depicting the process steps for fabricating an eleventh embodiment of a semiconductor memory cell having a tree-type capacitor according to the invention.

Referring to FIG. 12A together with FIG. 3B, a polysilicon layer 170 and an insulating layer 171 are sucessively formed over the wafer of FIG. 3B, to a thickness of about 1,000 Å, for example. The insulating layer 171 is preferably a silicon dioxide layer. After that, a conventional photolithographic and etching process is used to define and etch away selected parts of the insulating layer 171 so as to form contact holes 174a, 174b which extend from the top surface of the insulating layer 171 to the top surface of the polysilicon layer 170. Subsequently, a thick polysilicon layer is deposited over the wafer to a thickness of about 7,000 Å, for example. The thick polysilicon layer can be diffused with impurities such as arsenic (As) ions so as to increase the conductivity thereof. After that, a conventional photolithographic and etching process is performed on the wafer so as to form the thick polysilicon layer into two pillar-like polysilicon layers 172a, 172b. These polysilicon pillars 172a, 172b extend from the top surface of the polysilicon layer 170 substantially upright through the contact holes 174a, 174b toward the top of the wafer. This allows the polysilicon pillars 172a, 172b to be in electrical connection with the bottom level of storage electrodes.

Figure 12B:
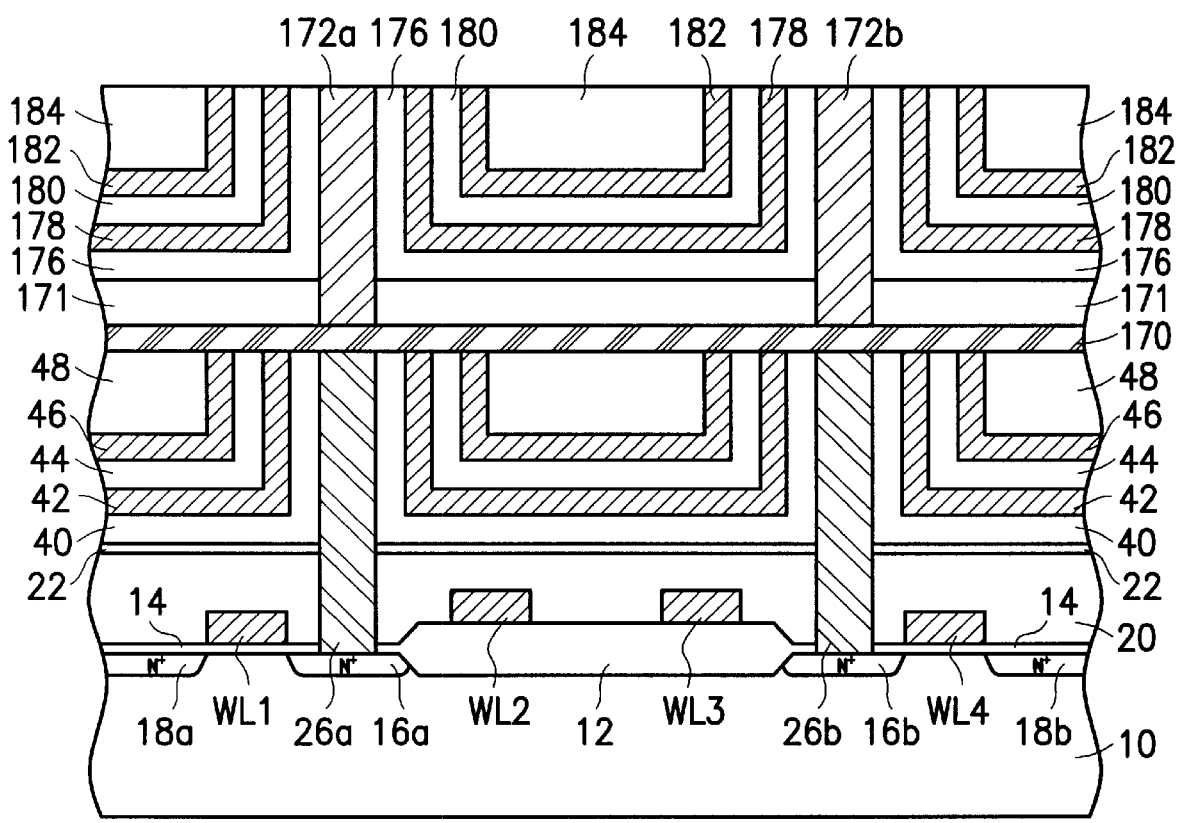

Referring to FIG. 12B, the same process steps as described with reference to FIGS. 3A and 3B are used here again to form the semiconductor structure shown in FIG. 12B, i.e., the CVD method is used first to deposit alternate layers of insulating layers 176, 180, 184 and polysilicon layers 178, 182, and then the CMP process is performed on the wafer until the top of the polysilicon pillars 172a, 172b is exposed.

Figure 12C:
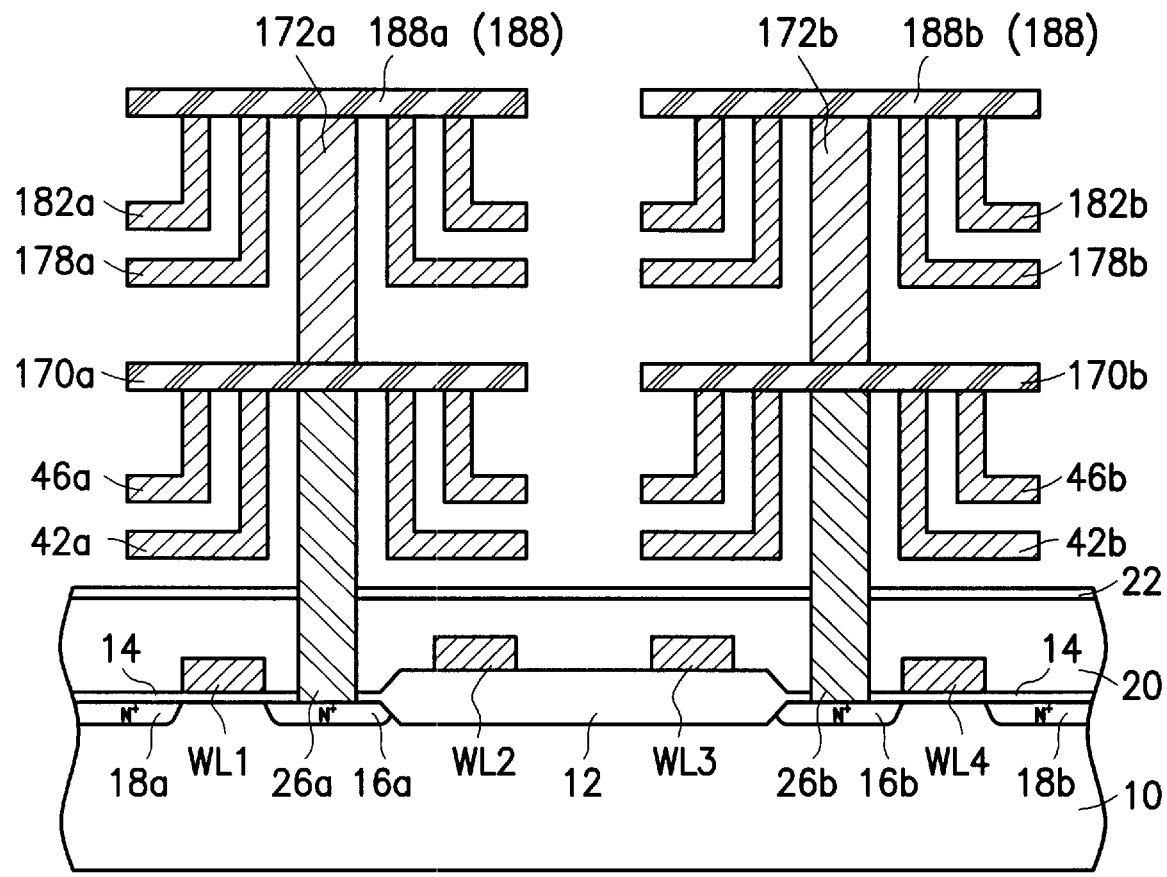

Referring to FIGS. 12B and 12C, the same process steps as described with reference to FIG. 3C are used to form the semiconductor structure shown in FIG. 12C. First, a polysilicon layer 188 is deposited to a thickness of about 1,000 Å, for example. After that, a conventional photolithographic and etching process is used to define and etch away selected parts of the polysilicon layer 188, the insulating layer 184, the polysilicon layer 182, the insulating layer 180, the polysilicon layer 178, the insulating layers 176 and 171, the polysilicon layer 170, the insulating layer 48, the polysilicon layer 46, the insulating layer 44, and the polysilicon layer 42. As a result of this process, the polysilicon layer 188 is cut into separate sections 188a and 188b, the polysilicon layer 182 is cut into separate sections 182a and 182b, the polysilicon layer 178 is cut into separate sections 178a and 178b, the polysilicon layer 170 is cut into separate sections 170a and 170b, the polysilicon layer 46 is cut into separate sections 46a and 46b, and the polysilicon layer 42 is cut into separate sections 42a and 42b.

These sections 188a, 188b, 182a, 182b, 178a, 178b, 170a, 170b, 46a, 46b, 42a, and 42b serve as branch-like conductive layers for the tree-like capacitors of the DRAM cells in the wafer.

Subsequently, wet etching is performed on the wafer, with the etching protection layer 22 as the etch end point, so as to remove the exposed insulating layers 184, 180, 176, 171, 48, 44 and 40. This completes the formation of the storage electrodes for the tree-type capacitor of DRAM cells in the wafer.

As shown in FIG. 12C, the thus formed storage electrodes are composed of two levels of storage electrodes, the bottom level including the trunk-like conductive layers 26a, 26b, the upper branch-like conductive layers 170a, 170b, the substantially L-shaped suspended branch-like conductive layers 42a, 46a and 42b, 46b, and the top level including the trunk-like conductive layer 172a, 172b, the upper branch-like conductive layers 188a, 188b, and the substantially L-shaped suspended branch-like conductive layers 178a, 182a, and 178b, 182b. This embodiment has the advantage of significantly increasing the charge storage area of the tree-type capacitor.

Twelfth Preferred Embodiment

In the foregoing embodiments, the bottom of the polysilicon pillars are directly electrically connected to the drain regions of the transfer transistors in the DRAM cells. However, the invention is not limited to such a structure. The twelfth embodiment is a tree-type capacitor which has its polysilicon pillars electrically connected via a conductive layer to the drain regions of the transfer transistors, as is described below with reference to FIGS. 13A and 13B.

The tree-type capacitor of the twelfth embodiment is based on the wafer structure of FIG. 2A. Elements in FIGS. 13A and 13B that are identical to those in FIG. 2A are labeled with the same numerals.

Figure 13A:
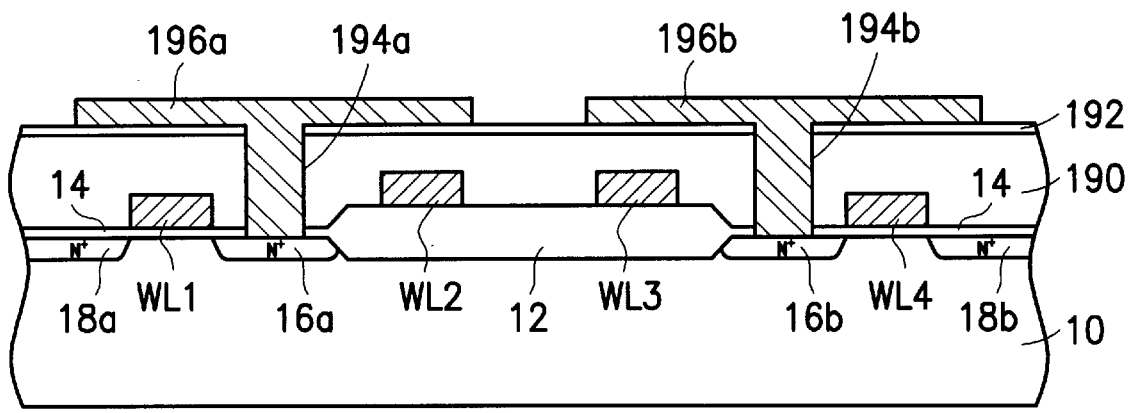
FIGS. 13A and 13B are cross-sectional views depicting the process steps for fabricating a twelfth embodiment of a semiconductor memory cell having a tree-type capacitor according to the invention.

Referring to FIG. 13A together with FIG. 2A, the CVD method is applied to deposit a planarization insulating layer 190 such as a layer of borophosphosilicate glass (BPSG) on the wafer of FIG. 2A. Then the same method is used to form an etching protection layer 192 such as a silicon nitride layer. After that, a conventional photolithographic and etching process is used to remove selected parts of the etching protection layer 192 and the planarization insulating layer 190, so as to form storage electrode contact holes 194a, 194b which extend from the top surface of the etching protection layer 192 to the surface of the drain regions 16a, 16b. Subsequently, a thick polysilicon layer is deposited over the wafer. The thick polysilicon layer can be further diffused with impurities such as arsenic ions so as to increase the conductivity thereof. After that, a conventional photolithographic and etching process is used to etch away selected parts of the thick polysilicon layer so as to reshape the thick polysilicon layers into substantially T-shaped polysilicon layers 196a, 196b which extend from the surface of the drain regions 16a, 16b upright through the storage electrode contact holes 194a, 194b. Alternatively, the formation of the polysilicon layers can be carried out together with the formation of the storage electrodes for the charge storage capacitor of each DRAM cell.

Figure 13B:
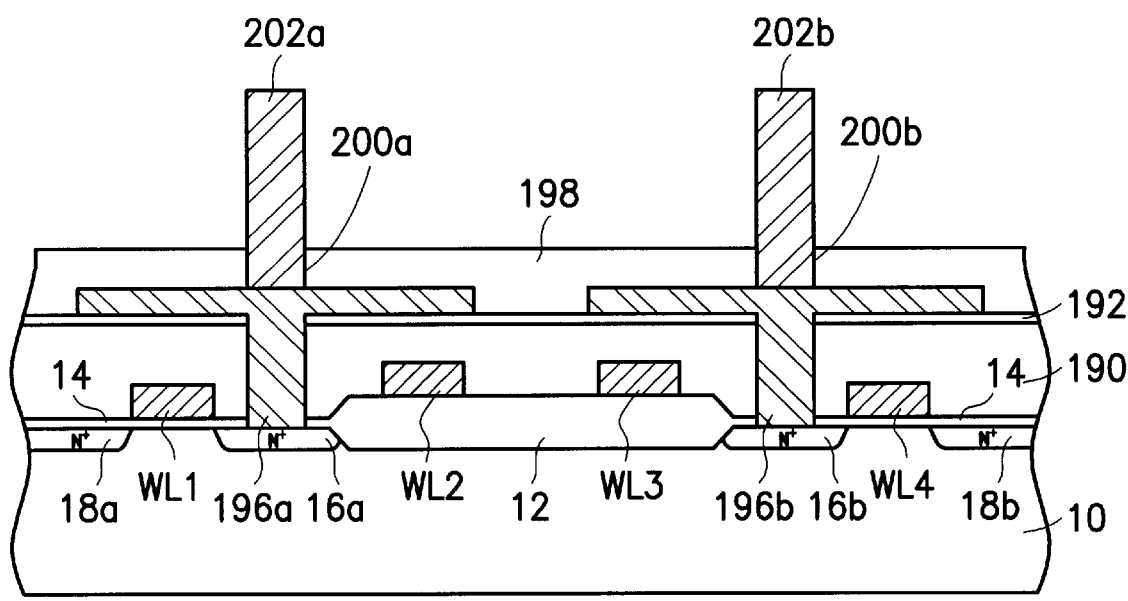

Referring next to FIG. 13B, in the subsequent step an insulating layer 198 such as a silicon dioxide layer is deposited over the wafer. After that, a conventional photolithographic and etching process is used to define and etch away selected parts of the insulating layer 198 so as to form windows 200a, 200b through the insulating layer 198 and expose the top surface of the substantially T-shaped polysilicon layers 196a, 196b. Subsequently, a thick polysilicon layer is deposited over the wafer to a thickness of about 7,000 Å, for example. Further, the thick polysilicon layer can be diffused with impurities such as arsenic (As) ions so as to increase the conductivity thereof. After that, a conventional photolithographic and etching process is used to define and etch away selected parts of the thick polysilicon layer so as to form polysilicon pillars 202a, 202b which extend from the top surface of the substantially T-shaped polysilicon layers 196a, 196b upright through the windows 200a, 200b to above the top of the wafer. These polysilicon pillars 202a, 202b serve as a top portion of the trunk-like conductive layer for the charge storage capacitor of the DRAM cell.

To complete the fabrication of the DRAM chip, the wafer of FIG. 13B can be further processed with steps such as are described above with respect to the first through eighth and the eleventh embodiments.

It will be apparent to those skilled in the art of semiconductor fabrication that the foregoing disclosed embodiments can be applied either alone or in combination so as to provide storage electrodes of various sizes and shapes on a single DRAM chip. These variations are all within the scope of the invention.

Although in the accompanying drawings the embodiments of the drains of the transfer transistors are based on diffusion areas in a silicon substrate, other variations, for example trench type drain regions, are possible.

Elements in the accompanying drawings are schematic diagrams for demonstrative purpose and do not depict the actual scale. The dimensions of the elements of the invention as shown should by no means be considered limitations on the scope of the invention.

While the invention has been described by way of example and in terms of preferred embodiments, it is to be understood that the invention is not limited to the disclosed embodiments. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A semiconductor memory device, comprising:
   (a) a substrate;
   (b) a transfer transistor formed on said substrate, said transfer transistor having source/drain regions; and
   (c) a tree-type capacitor electrically connected to one of said source/drain regions, said tree-type capacitor including:
      (i) at least one trunk-like conductive layer having a top and having a bottom end electrically coupled to said one of said source/drain regions, said at least one trunk-like conductive layer including at least a pillar-like portion extending substantially upright from said bottom end;
      (ii) at least one upper branch-like conductive layer electrically connected to said top of said at least one trunk-like conductive layer and having a bottom surface, a distal edge, and a proximal region disposed away from the distal edge; and
      (iii) at least one suspended branch-like conductive layer, including four segments, having one end connected to said bottom surface of said at least one upper branch-like conductive layer, within the proximal region, wherein said at least one trunk-like conductive layer, said at least one upper branch-like conductive layer, and said at least one suspended branch-like conductive layer in combination from a storage electrode for said tree-type capacitor, and wherein the four segments are serially connected such that adjacent segments from an angle of less than 180° therebetween;
      (iv) a dielectric layer formed over exposed surfaces of said at least one trunk-like conductive layer, said at least one upper branch-like conductive layer, and said at least one bottom branch-like conductive layer; and
      (v) an overlaying conductive layer overlaying said dielectric layer, said overlaying conductive layer serving as an opposing electrode of said tree-type capacitor.

2. A semiconductor memory device as claimed in claim 1, wherein said at least one suspended branch-like conductive layer includes a plurality of pairs of suspended branch-like conductive layers, each pair being substantially symmetrically arranged with respect to said at least one trunk-like conductive layer and each suspended branch-like conductive layer having one end connected to said bottom surface of said at least one upper branch-like conductive layer, within the proximal region.

3. A semiconductor memory device, comprising:
   (a) a substrate;
   (b) a transfer transistor formed on said substrate, said transfer transistor having source/drain regions; and
   (c) a tree-type capacitor electrically connected to one of said source/drain regions, said tree-type capacitor including:
      (i) at least one trunk-like conductive layer having an upper end and a tops and having a bottom end electrically coupled to said one of said source/drain regions, said at least one trunk-like conductive layer including at least a pillar-like portion extending substantially upright from said bottom end;
      (ii) at least one suspended branch-like conductive layer having at least a first segment, a second segment, and a third segment, said second segment being connected to and angled with respect to said first segment, said third segment being connected to and positioned substantially at a right angle with respect to said second segment, and said first segment having one end connected to a side surface of said at least one trunk-like conductive layer, away from the upper end of the at least one trunk-like conductive layer, and wherein said at least one trunk-like conductive layer, and said at least one suspended branch-like conductive layer in combination form a storage electrode for said tree-type capacitor;
      (iii) a dielectric layer formed over substantially the entire surface area of said at least one trunk-like conductive layer, and substantially the entire surface area of said at least one suspended branch-like conductive layer; and
      (iv) an overlaying conductive layer overlaying said dielectric layer, said overlaying conductive layer serving as an opposing electrode of said tree-type capacitor.

4. A semiconductor memory device as claimed in claim 3, wherein said pillar-like portion of said at least one trunk-like conductive layer has a hollowed interior.

5. A semiconductor memory device as claimed in claim 4, wherein said at least one trunk-like conductive layer is substantially U-shaped in cross section.

6. A semiconductor memory device as claimed in claim 3, wherein said at least one trunk-like conductive layer includes:
   a substantially solid bottom segment having a top and being electrically connected to said one of said source/drain regions, and
   an upper segment substantially T-shaped in cross section and connected to said top of said bottom segment.

7. A semiconductor memory device as claimed in claim 6, wherein said at least one suspended branch-like conductive layer is connected to said upper segment of said at least one trunk-like conductive layer.

8. A semiconductor memory device as claimed in claim 3, wherein said at least one trunk-like conductive layer includes:
   a bottom segment having a top and being electrically connected to said one of said source/drain regions, and
   an upper segment which is substantially T-shaped in cross section and has a hollowed interior, said upper segment being connected to said top of said bottom segment.

9. A semiconductor memory device as claimed in claim 3, wherein said at least one suspended branch-like conductive layer is connected to said top of said at least one trunk-like conductive layer.

10. A semiconductor memory device as claimed in claim 3, wherein said at least one trunk-like conductive layer is substantially T-shaped in cross section.

11. A semiconductor memory device as claimed in claim 8, wherein said second segment extends upright and wherein said third segment is horizontally connected to said second segment.

* * * * *